United States Patent
Zuo

(10) Patent No.: US 10,880,635 B2
(45) Date of Patent: Dec. 29, 2020

(54) ELECTRONIC DEVICE

(71) Applicant: GUANGDONG OPPO MOBILE TELECOMMUNICATIONS CORP., LTD., Guangdong (CN)

(72) Inventor: Zhouquan Zuo, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/693,334

(22) Filed: Nov. 24, 2019

(65) Prior Publication Data

US 2020/0213723 A1 Jul. 2, 2020

(30) Foreign Application Priority Data

Dec. 29, 2018 (CN) .......................... 2018 1 1640399

(51) Int. Cl.
| | |
|---|---|
| *H04R 1/34* | (2006.01) |
| *H04R 1/04* | (2006.01) |
| *H04R 1/08* | (2006.01) |
| *H05K 5/00* | (2006.01) |
| *H05K 5/02* | (2006.01) |

(52) U.S. Cl.
CPC .............. *H04R 1/342* (2013.01); *H04R 1/04* (2013.01); *H04R 1/08* (2013.01); *H05K 5/0017* (2013.01); *H05K 5/0217* (2013.01); *H04R 2499/15* (2013.01)

(58) Field of Classification Search
CPC ... H04R 1/34; H04R 1/02; H04R 1/04; H04R 1/342; H04R 2499/11; H04R 2499/15

USPC .......................... 381/92, 306, 333, 386, 388
See application file for complete search history.

(56) References Cited

U.S. PATENT DOCUMENTS

| | | | | |
|---|---|---|---|---|
| 8,885,876 | B2 | 11/2014 | Huang et al. | |
| 2006/0152417 | A1* | 7/2006 | Ying | H01Q 1/44 343/702 |
| 2013/0188807 | A1* | 7/2013 | Slotte | H04R 3/00 381/99 |

(Continued)

FOREIGN PATENT DOCUMENTS

| | | |
|---|---|---|
| CN | 1810013 | 10/2010 |
| CN | 102279648 | 12/2011 |

(Continued)

OTHER PUBLICATIONS

WIPO, English translation of the ISR and WO for PCT/CN2019/118527, dated Jan. 22, 2020.

(Continued)

*Primary Examiner* — Melur Ramakrishnaiah
(74) *Attorney, Agent, or Firm* — Hodgson Russ LLP

(57) ABSTRACT

The embodiment of the disclosure provides an electronic device. The main body includes a first end portion and a side portion coupled to the first end portion, the main body is enabled in a standing state by the supporting of the first end portion, the side portion defines at least two first electroacoustic holes, the at least two first electroacoustic holes are spaced apart in a direction surrounding the side portion. The at least one electroacoustic component is disposed in the main body and configured to transmit sound signals through the at least two electroacoustic holes. The embodiment of the disclosure can transmit sound signals multi-directionally.

20 Claims, 25 Drawing Sheets

(56) References Cited

U.S. PATENT DOCUMENTS

| | | | |
|---|---|---|---|
| 2014/0112518 A1* | 4/2014 | Lee | H04R 1/04 |
| | | | 381/365 |
| 2014/0219491 A1 | 8/2014 | Ludlum et al. | |
| 2016/0179236 A1* | 6/2016 | Shin | G06F 1/1616 |
| | | | 345/173 |
| 2017/0094040 A1* | 3/2017 | Huh | H04R 1/345 |
| 2018/0138582 A1* | 5/2018 | Wu | H01Q 13/10 |
| 2018/0210559 A1 | 7/2018 | Xia et al. | |

FOREIGN PATENT DOCUMENTS

| | | |
|---|---|---|
| CN | 102339177 | 2/2012 |
| CN | 103997709 | 8/2014 |
| CN | 106162467 | 11/2016 |
| CN | 106231512 | 12/2016 |
| CN | 106790803 | 5/2017 |
| CN | 106878563 | 6/2017 |
| CN | 206894891 | 1/2018 |
| CN | 108307013 | 7/2018 |
| CN | 108877532 | 11/2018 |
| EP | 3136223 | 3/2017 |
| WO | 2017113242 | 7/2017 |

OTHER PUBLICATIONS

EPO, Office Action for EP Application No. 19214947.4, dated May 29, 2020.
SIPO, First Office Action for CN Application No. 201811640399.4, dated Sep. 25, 2020.

* cited by examiner

ELECTRONIC DEVICE

CROSS REFERENCE TO RELATED APPLICATION

This application claims priority to Chinese Patent Application No. 201811640399.4, filed Dec. 29, 2018, the entire disclosure of which is incorporated herein by reference.

TECHNICAL FIELD

The present disclosure relates to the field of electronic technologies, and more particular, to an electronic device.

BACKGROUND

With the development of communication technologies, electronic devices such as smart phones are becoming more and more popular. During the use of the electronic device, the electronic device can transmit sound signals using its microphone, receiver, and the like.

In the related art, the electronic device is generally flat, and has a display surface and a non-display surface. Usually, the non-display surface serves as a bearing surface of the electronic device to support the electronic device. The display surface of the electronic device is usually used to display images. The microphone, the receiver, and the like of the electronic device transmit the sound signals from the display surface and the external of the electronic device.

In the actual use of such an electronic device, the input and output of the sound have a specific direction, which is limited by the display surface and affects the user's demand for the transmission of the sound signals.

SUMMARY

An embodiment of the disclosure provides an electronic device, which is capable of implementing multi-directional transmission for sound signals.

An embodiment of the disclosure further provides an electronic device, which includes a main body and an electroacoustic component. The main body includes a first end portion and a side portion coupled to the first end portion, the main body is enabled in a standing state by the supporting of the first end portion, the side portion defines at least two first electroacoustic holes, the at least two first electroacoustic holes are spaced apart in a direction surrounding the side portion. The at least one electroacoustic component is disposed in the main body and configured to transmit sound signals through the at least two electroacoustic holes.

An embodiment of the disclosure further provides an electronic device, which includes a main body, a flexible display, a receiver, and a microphone. The main body includes a first end portion, a second end portion and a side portion, the side portion connects the first end portion and the second end portion, and defines at least two first electroacoustic holes spaced apart, at least two second electroacoustic holes spaced apart, a receiving cavity, and a third opening communicated with the receiving cavity. The at least two first electroacoustic holes are adjacent to the first end portion, the at least two second electroacoustic holes are adjacent to the second end portion, the third opening has a length direction parallel to a central axis of the main body. The flexible display has a first state received in the receiving cavity of the main body and a second state extended from the main body through the third opening of the side portion. The receiver is disposed on the first end portion and configured for transmitting sound signals through the at least two first electroacoustic holes. The microphone is disposed on the second end portion and configured for receiving sound signals through the at least two second electroacoustic holes.

An embodiment of the disclosure further provides an electronic device, which includes a main body, an electroacoustic carrier, an outer cover, and an electroacoustic component. The main body includes an end portion, the end portion defines an opening. The electroacoustic carrier is disposed in the opening of the end portion, the electroacoustic carrier defines at least two electroacoustic channels, and the at least two electroacoustic channels are spaced apart and communicated with the external of the main body. The outer cover covers the opening and defines a flat supporting surface, the flat supporting surface enabling the main body to keep in a standing state that a central axis of the main body is perpendicular to the flat supporting surface. The electroacoustic component is disposed in the main body, the electroacoustic device transmits sound signals to the external of the main body through the at least two electroacoustic channels.

In the embodiments of the disclosure, the electroacoustic component can transmit sound signals in the direction around the side portion through the at least two electroacoustic channels, as such the sound signals can be transmitted in multiple directions.

BRIEF DESCRIPTION OF THE DRAWINGS

In order to more clearly illustrate the technical solutions in the embodiments of the disclosure, the drawings used in the description of the embodiments will be briefly described below.

DETAILED DESCRIPTION

The embodiments of the disclosure provide an electronic device, which may be a smart phone, a smart computer, or the like.

Figure 1:
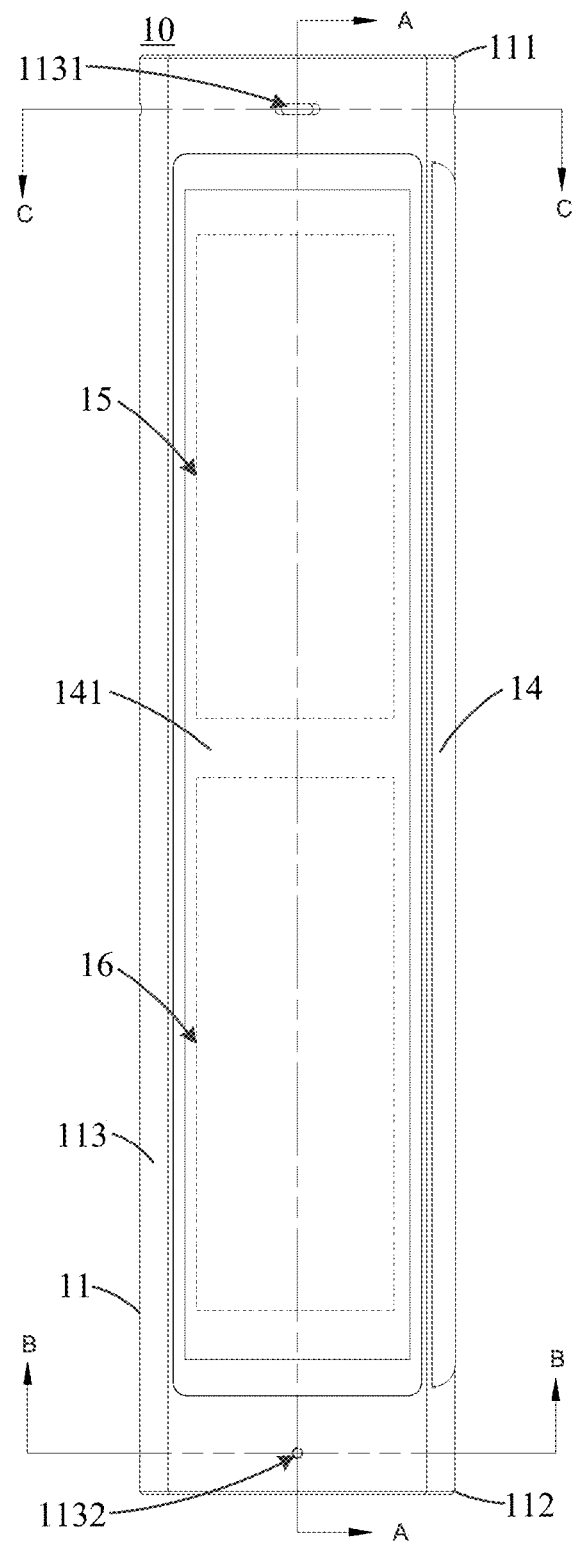
FIG. 1 is a front elevational view of an electronic device according to an embodiment of the disclosure.
Figure 2:
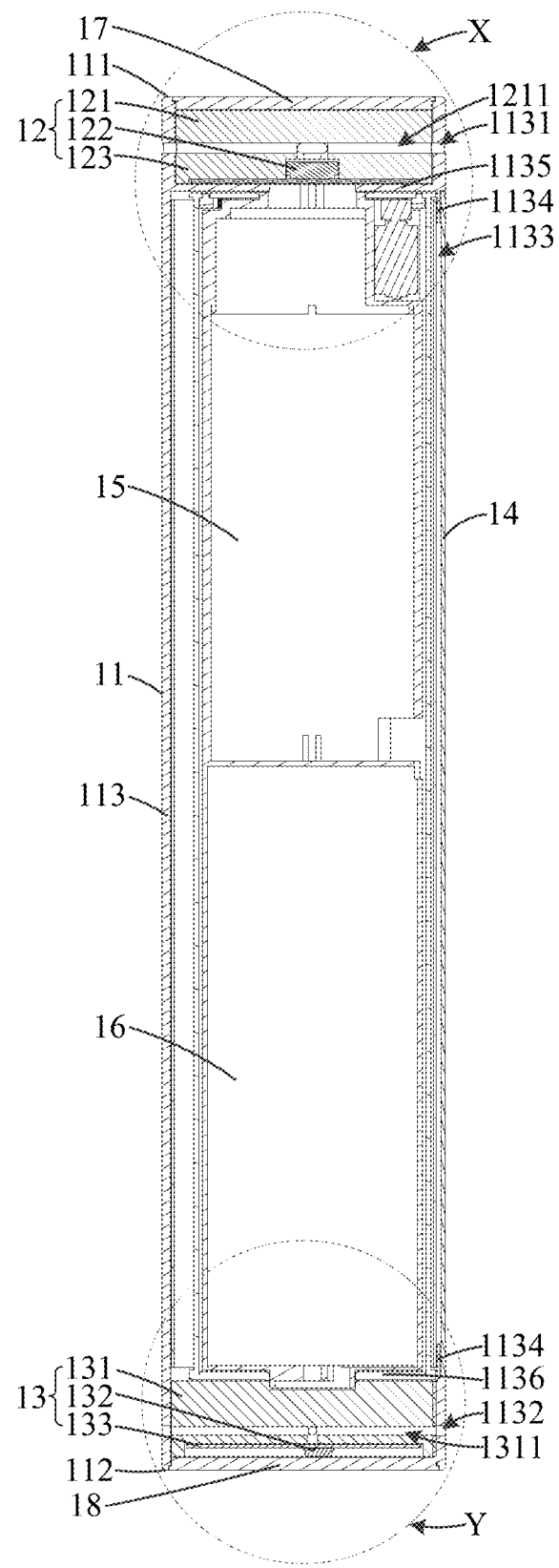
FIG. 2 is a cross-sectional view of the electronic device of FIG. 1 in the A-A direction.

Please refer to FIG. 1 and FIG. 2, FIG. 1 is a front view of an electronic device according to an embodiment of the disclosure, and FIG. 2 is a cross-sectional view of the electronic device of FIG. 1 taken along the section line A-A.

The electronic device 10 may include a main body 11, a first electroacoustic assembly 12, a second electroacoustic assembly 13, a flexible display 14, a main board 15, and a battery 16. The first electroacoustic assembly 12, the second electroacoustic assembly 13, the flexible display 14, the main board 15, and the battery 16 are all disposed in the main body 11. The first electroacoustic assembly 12, the second electroacoustic assembly 13, the flexible display 14 and the battery 16 are all coupled to the main board 15. In some embodiments, the electronic device 10 as a whole may be cylindrical, truncated cone, polyhedral, or the like.

Figure 3:
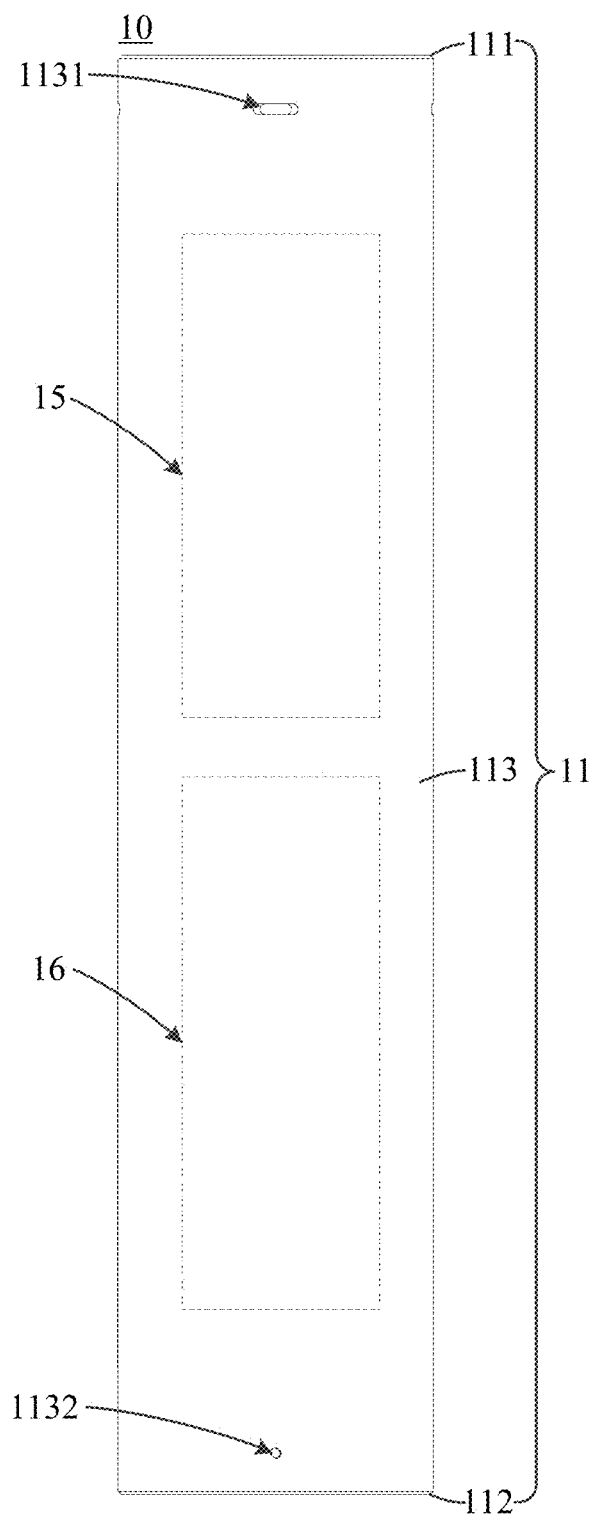
FIG. 3 is a rear view of the electronic device according to an embodiment of the disclosure.
Figure 4:
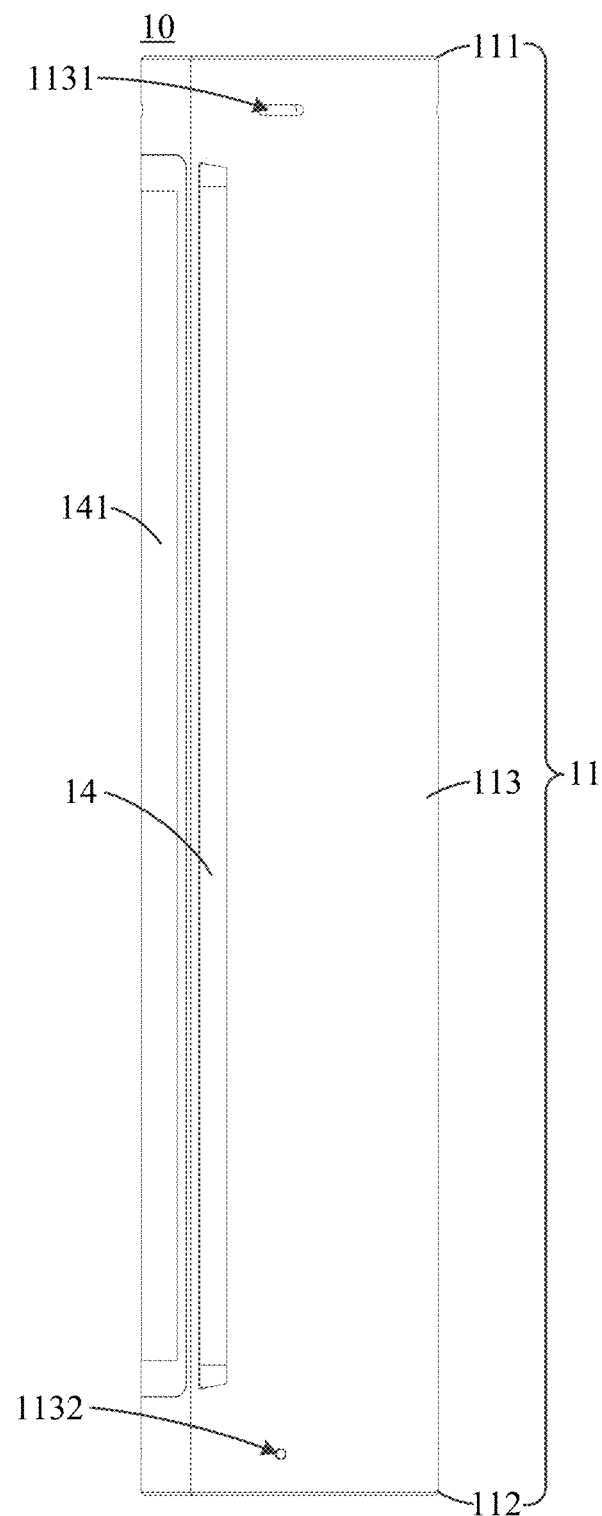
FIG. 4 is a side view of the electronic device according to an embodiment of the disclosure.
Figure 5:
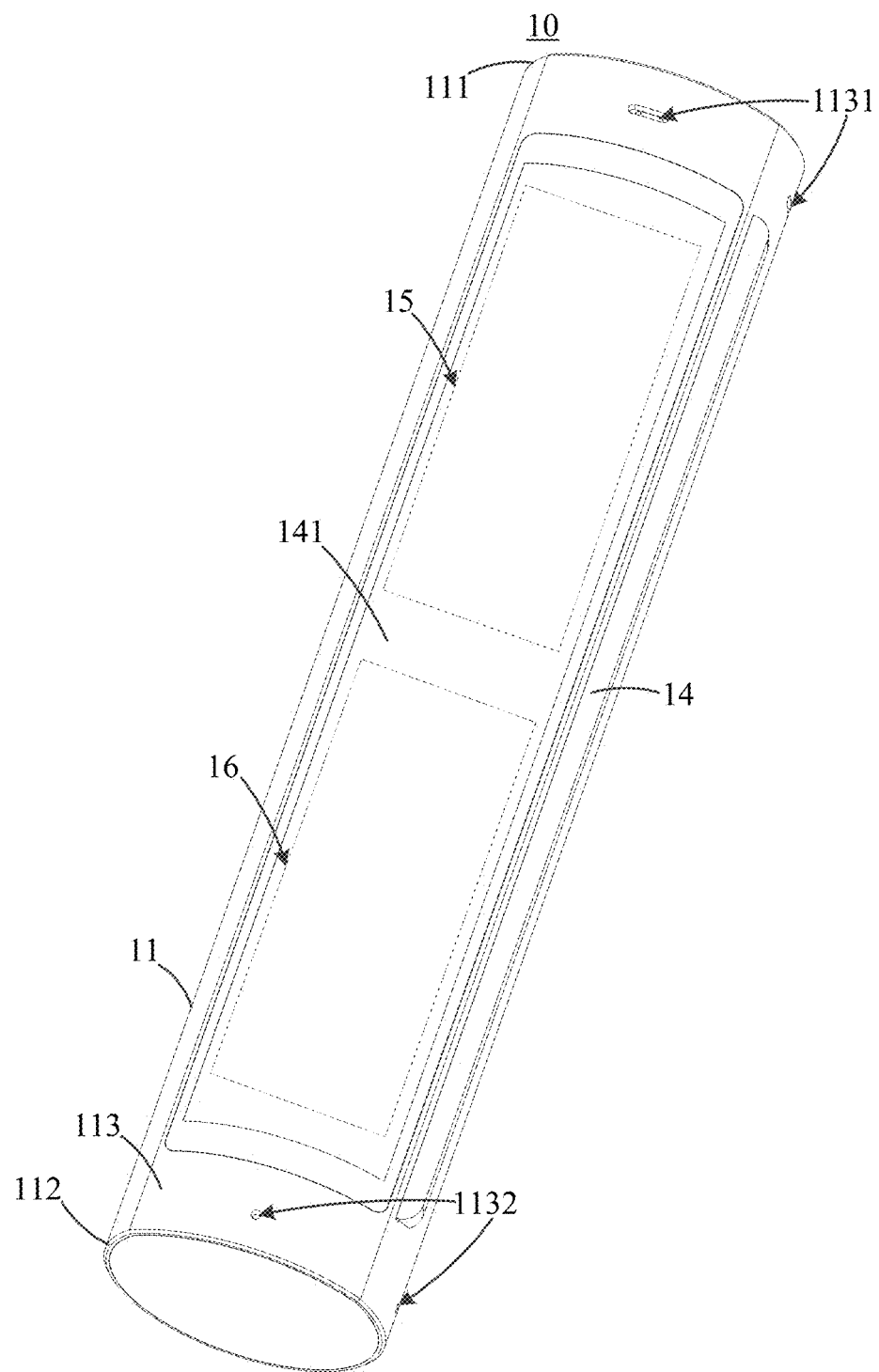
FIG. 5 is a perspective view of the electronic device according to an embodiment of the disclosure.

Please also refer to FIGS. 3-5, FIG. 3 is a rear view of the electronic device according to an embodiment of the present disclosure, FIG. 4 is a side view of the electronic device according to an embodiment of the disclosure, and FIG. 5 is a perspective view of the electronic device according to an embodiment of the disclosure.

The electronic device according to an embodiment of the disclosure will be specifically described below based on FIGS. 1-5.

It should be noted that the electronic device 10 is not limited to the above description, and the electronic device 10 may include more components. For example, the electronic device 10 may include a camera, a sensor, and the like. In some embodiments, the camera can be coupled to the main board 15 for photographing, video recording, or character recognition.

It should be noted that in the description of the disclosure, the terms "install", "connect", and "coupled" should be understood broadly. For example, it may be fixedly connected, detachably connected, or integrally connected; can be mechanically coupled, electrically coupled, or can be communicated with each other; can be directly connected or indirectly connected through an intermediary medium; also can be an internal communication of two elements or an interaction between two elements. For those skilled in the art, the specific meanings of the above terms in the disclosure can be understood on a case-by-case basis.

Figure 6:
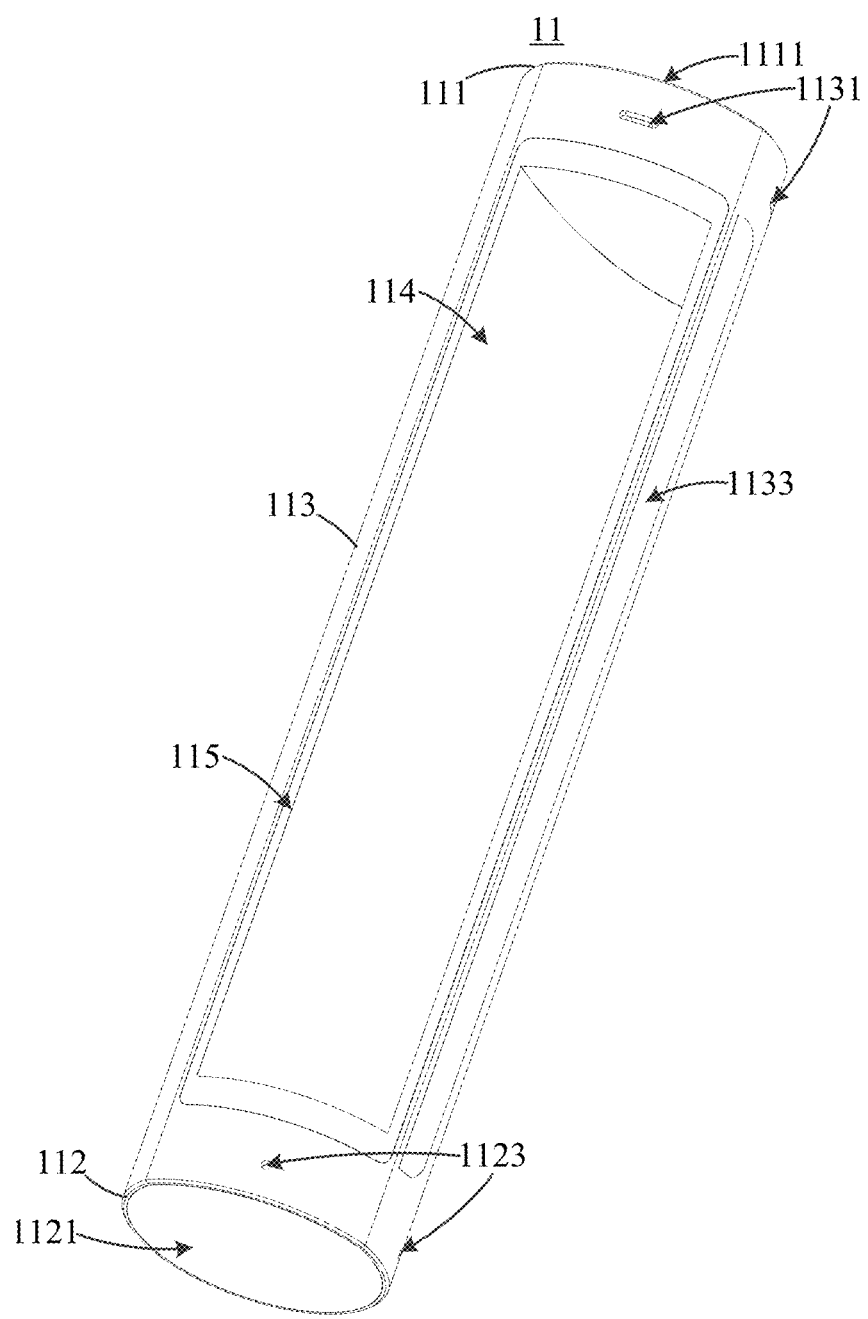
FIG. 6 is a schematic structural view of a main body in the electronic device shown in FIGS. 1-5.
Figure 7:
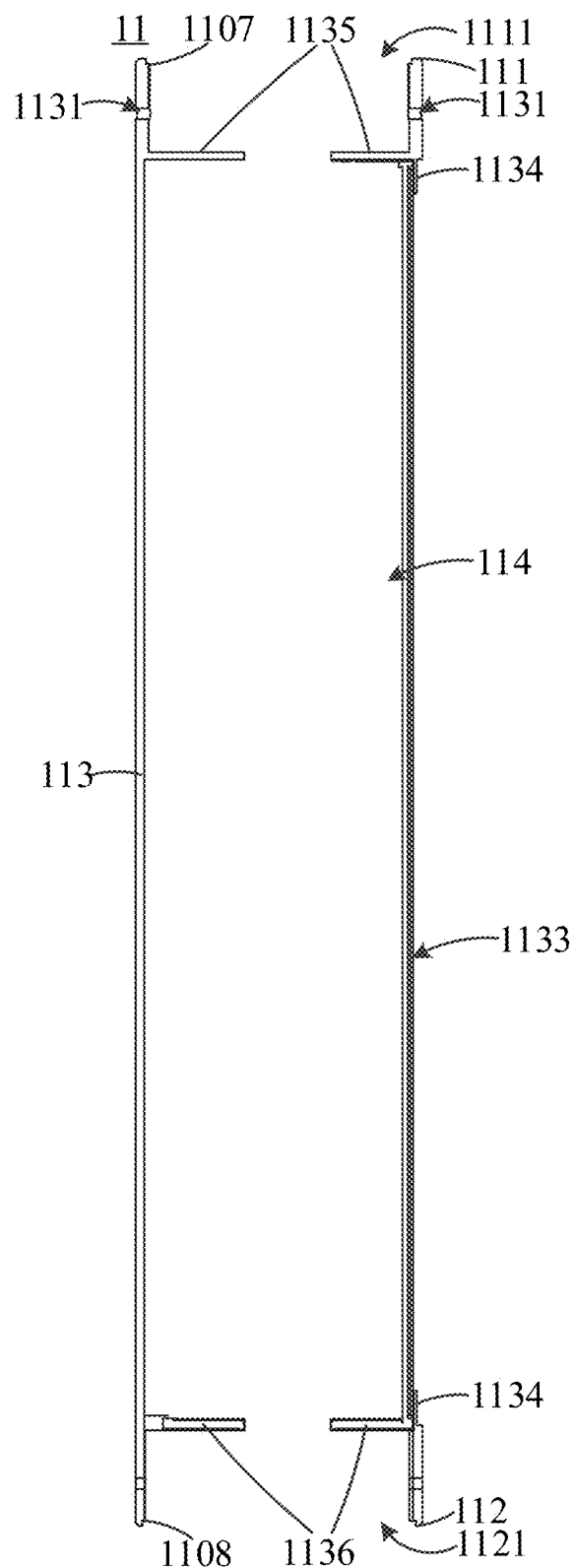
FIG. 7 is a partial cross-sectional view of the main body of the electronic device in the A-A direction.

Please refer to FIG. 6 and FIG. 7. FIG. 6 is a schematic structural view of the main body of the electronic device shown in FIGS. 1 to 5, and FIG. 7 is a partial cross-sectional view of the main body taken along the line A-A. The main body 11 can be served as a carrier of the electronic device 10, and can carry components of the electronic device 10, such as the first electroacoustic assembly 12, the second electroacoustic assembly 13, the flexible display 14, the main board 15, the battery 16, and the like. In some embodiments, the main body 11 can be a plastic body, a glass body, a metal body or a ceramic body, or the like. The material of the metal body can be aluminum alloys, magnesium alloys, magnesium aluminum alloys, stainless steels, and the like. It should be noted that the main body 11 may also be formed by materials of metal and plastic.

The main body 11 may form an outer contour of the electronic device 10, and the main body 11 may have a regular shape. In some embodiments, the main body 11 may be a columnar structure, in other words, a bar structure, such as a cylindrical structure, a truncated cone structure, a cone structure, a polyhedral structure and so on. That is, the cross-sectional view of the main body 11 taken along the line B-B or the line C-C may form a circle or a polygon. It should be noted that the main body 11 may also have an irregular shape.

The polygon formed by the cross-sectional view of the main body 11 taken along the line B-B or the line C-C may be a triangle, a quadrangle, a pentagon or a hexagon. In some embodiments, please refer to FIG. 8, which is a first cross-sectional view of the main body taken along the line B-B or the line C-C, at least two sides of the polygon may be equal. For example, the first cross-sectional view of the main body 11 taken along the line B-B or the line C-C forms a triangle, and two sides of the triangle are substantially equal, and the triangle includes a first side 1101, a second side 1102, and a third side 1103 which are sequentially connected, wherein the length of the first side 1101 and the length of the second side 1102 are equal, and the length of the third side 1103 is different from that of the first side 1101 and the second side 1102. For another example, two or three sides of a quadrangle are substantially equal.

Figure 9:
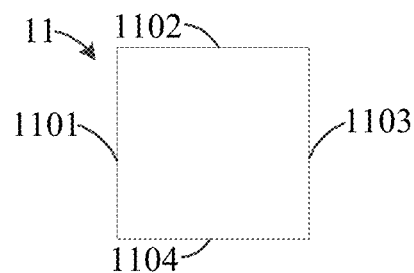
FIG. 9 is a second cross-sectional view of the main body of the electronic device in the B-B direction or the C-C direction.

In some embodiments, please refer to FIG. 9, which is a second cross-sectional view of the main body taken along the line B-B or the line C-C, wherein the polygon may be substantially a regular polygon, that is, the lengths of the sides of the polygon are substantially equal. For example, the second cross-sectional view of the main body 11 taken along the line B-B or the line C-C forms a regular quadrangle, and the regular quadrangle has a first side 1101, a second side 1102, a third side 1103, and a fourth side 1104 which are sequentially connected, and the length of the first side 1101, the length of the second side 1102, the length of the third side 1103, and the length of the fourth side 1104 are equal.

Figure 10:
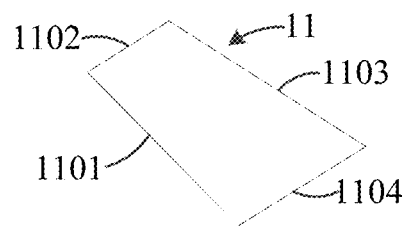
FIG. 10 is a third cross-sectional view of the main body of the electronic device in the B-B direction or the C-C direction.

In some embodiments, please refer to FIG. 10, which is a third cross-sectional view of the main body taken along the line B-B or the line C-C. The polygon formed by the cross-sectional view of the main body 11 taken along the line B-B or the line C-C, may be not a regular polygon, that is, every side of the polygon can be unequal. For example, the polygon includes a first side 1101, a second side 1102, a third side 1103, and a fourth side 1104 that are sequentially connected, the length of the first side 1101, the length of the second side 1102, the length of the third side 1103, and the fourth of the fourth side 1104 are not equal.

Figure 11:
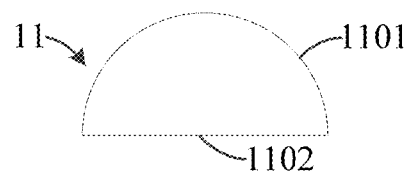
FIG. 11 is a fourth cross-sectional view of the main body of the electronic device in the B-B direction or the C-C direction.

In some embodiments, please refer to FIG. 11, which is a fourth cross-sectional view of the main body taken along the line B-B or the line C-C. The cross-sectional view of the main body 11 taken along the line B-B or the line C-C may further form other shapes, including at least two sides, wherein one is a curved side and the other is a straight side. For example, the cross-sectional view of the main body 11 taken along the line B-B or the line C-C forms two sides, which include a curved side 1101 and a straight side 1102 connected to the curved side 1101.

Figure 12:
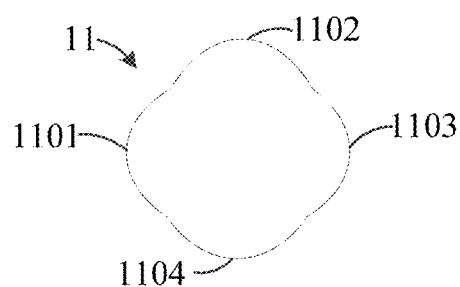
FIG. 12 is a fifth cross-sectional view of the main body of the electronic device in the B-B direction or the C-C direction.

In some embodiments, please refer to FIG. 12, which is a fifth cross-sectional view of the main body taken along the line B-B or the line C-C. The cross-sectional view of the main body 11 taken along the line B-B or the line C-C may further form other shapes, including at least two curved sides. For example, the cross-sectional view of the main body 11 taken along the line B-B or the line C-C forms four sides, which include a first curved side 1101, a second curved side 1102, a third curved side 1103, and a fourth curved side 1104 connected in sequence.

In some embodiments, the main body 11 may include a first end portion 111, a second end portion 112, and a side portion 113, wherein the first end portion 111 and the second end portion 112 are located at two opposite ends of the main body 11, and the first end portion 111 and the second end portion 112 are coupled by the side portion 113, in other words, the side portion 113 is connected between the first end portion 111 and the second end portion 112.

In some embodiments, referring to FIG. 6 and FIG. 7, the first end portion 111, the second end portion 112, and the side portion 113 form a receiving cavity 114 in the main body 11, and the receiving cavity 114 can receive the components of the electronic device 10. For example, the receiving cavity 114 receives the first electroacoustic assembly 12, the second electroacoustic assembly 13, the flexible display 14, the main board 15, the battery 16, and the like.

The shape formed by the first end portion 111 and the main body 11 in a cross-sectional view taken along the line B-B or the line C-C may be the same or different. In some embodiments, the first end portion 111 is configured to support the electronic device 10, for example, the first end portion 111 can be a planar structure, or a structure in which a central portion is recessed toward the internal of the electronic device 10. The first end portion 111 can support the electronic device 10 to make the electronic device 10 in a standing state. It should be noted that the first end portion 111 may not support the electronic device 10, for example, the first end portion 111 may have a tip shape, and for another example, the first end portion 111 may have a structure in which a central portion protrudes toward the external of the electronic device 10.

The shapes formed by the cross-sectional views of the first end portion 111 and the main body 11 taken along the line B-B or the line C-C may be parallel or not parallel.

In some embodiments, referring to FIG. 6 and FIG. 7, the main body 11 may have a first opening 1111 at the first end portion 111. Components of the electronic device 10, such as the first electroacoustic assembly 12, the second electroacoustic assembly 13, the main board 15, the battery 16, and the like, may be received into the receiving cavity 114 of the main body 11 through the first opening 1111. It should be noted that the main body 11 may not be provided with the first opening 1111 at the first end portion 111, for example, the main body 11 is closed at the first end portion 111.

In some embodiments, referring to FIG. 2, the electronic device 10 may further include a first outer cover 17, which is configured to cover and close the first opening 1111. The first outer cover 17 can be inserted into the main body 11 and fixedly connected to an inner surface of the main body 11. Referring to FIG. 7, the inner surface of the main body 11 is provided with a first limiting step 1107 for limiting the first outer cover 17. A portion of the first outer cover 17 is inserted into the main body 11, while another portion of the first outer cover 17 is placed on the first limiting step 1107. It should be noted that the first outer cover 17 may also be entirely placed on the first limiting step 1107. It also should be noted that the main body 11 cannot be provided with the first limiting step 1107, and the first outer cover 17 is directly inserted into the main body 11 to form a fixed connection.

The first limiting step 1107 may surround the inner surface of the main body 11. The first limiting step 1107 may also be one or more groove structures formed by recessing from the inner surface of the main body 11. Correspondingly, the first outer cover 17 may have one or more protruding structures disposed in the one or more groove structures, the protruding structure abuts against a bottom wall of the groove structure to achieve the restriction of the first outer cover 17. The first outer cover 17 can be restrained by the groove structure, in the direction from the internal toward the external of the main body 11. For example, the first outer cover 17 can be restrained in the direction from an outer surface toward the inner surface of the main body 11 by the groove structure. For another example, the first outer cover 17 can be restrained in the direction from the internal of the main body 11 toward the first opening 1111. It is understood that "more" refers the number of two or greater than two.

Figure 13:
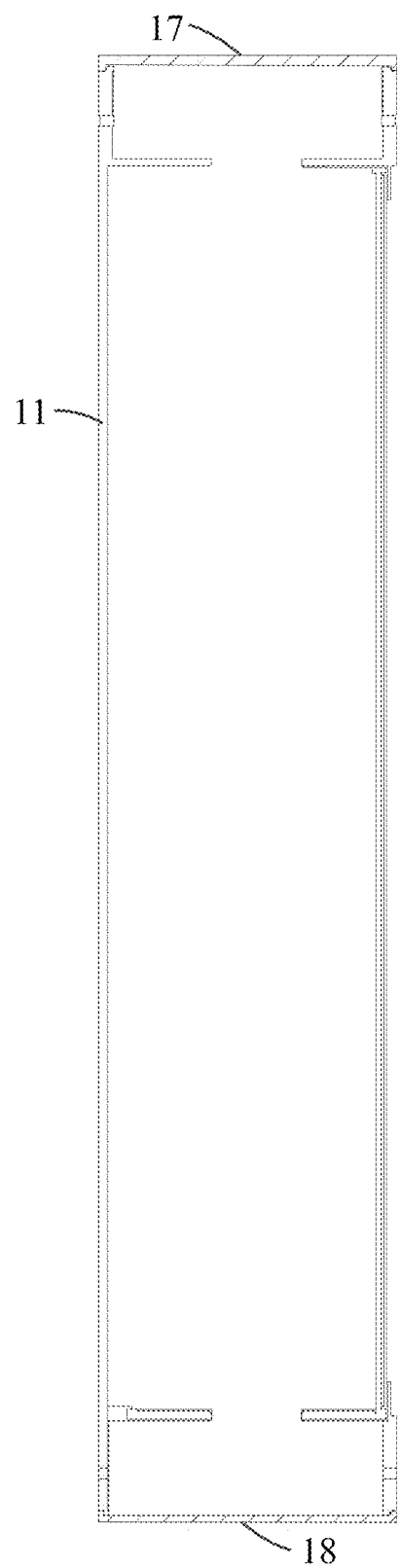
FIG. 13 is a schematic structural view showing the cooperation of a first outer cover, a second outer cover, and the main body of the electronic device shown in FIG. 2.
Figure 14:
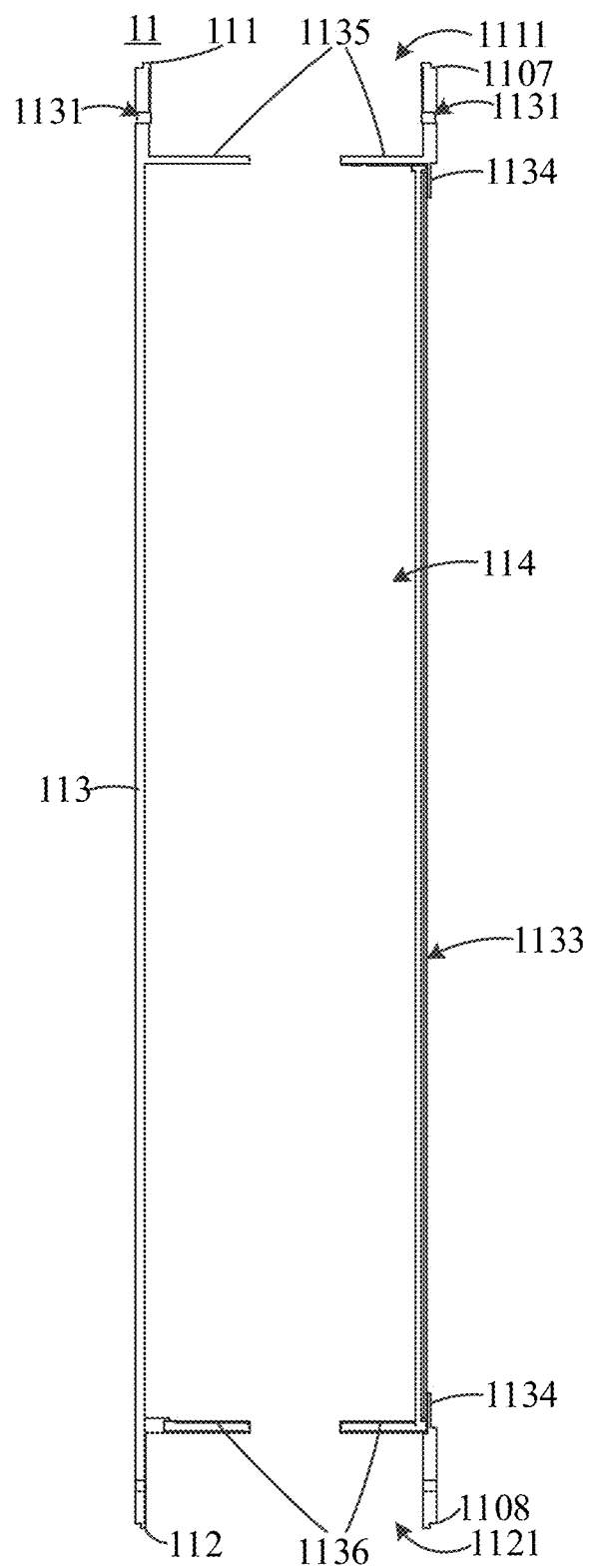
FIG. 14 is another partial cross-sectional view of the main body of the electronic device in the A-A direction.

It should be noted that the embodiment of the disclosure is not limited to inserting at least a portion of the first outer cover 17 into the main body 11 to achieve a fixed connection between the first outer cover 17 and the main body 11. For example, please refer to FIG. 13 and FIG. 14, FIG. 13 is a schematic diagram showing the cooperation of the first outer cover, the second outer cover and the main body of the electronic device as shown in FIG. 2, and FIG. 14 is another partial cross-sectional view of the main body in the electronic device taken along the line A-A. The first outer cover 17 may also be disposed on a periphery of the main body 11 and fixedly coupled to the outer surface of the main body 11. The first limiting step 1107 can also be provided on the outer surface of the main body 11, that is, the outer surface of the main body 11 forms the first limiting step 1107 for limiting the first outer cover 17. It should be noted that the main body 11 may not provide the first limiting step 1107, and the first outer cover 17 is directly sleeved on the periphery of the main body 11 to achieve the fixed connection.

In some embodiments, the first outer cover 17 can be coupled to the main body 11 in a detachable manner. Thus, when it is necessary to replace or repair the components received in the main body 11, the first outer cover 17 can be opened for replacement or overhaul.

For example, the first outer cover 17 and the main body 11 are fixedly connected in a manner of screwing. An outer surface of the first outer cover 17 is provided with external screw threads, the inner surface of the main body 11 is provided with internal screw threads, and the first outer cover 17 is fixedly coupled to the main body 11 by screwing the external screw threads of the first outer cover 17 with the internal screw threads of the main body 11. It should be noted that, an inner surface of the first outer cover 17 may be provided with external screw threads, and the outer surface of the main body 11 may be provided with external screw threads, and the first outer cover 17 is fixedly coupled to the main body 11 by screwing the external screw threads of the first outer cover 17 with the internal screw threads of the main body 11.

For another example, the first outer cover 17 is fixedly coupled to the main body 11 in a fastening manner. The first outer cover 17 is provided with a number of first buckles, the main body 11 is provided with a number of second buckles, and the first outer cover 17 is fixedly coupled to the main body 11 by the engagement of the first buckles and the second buckles.

For another example, the first outer cover 17 and the main body 11 are fixedly connected in an articulated manner. A hinge pin is provided between the first outer cover 17 and the main body 11 to perform a connection therebetween.

For another example, the first outer cover 17 and the main body 11 are fixedly connected by means of plugging. A chamfered structure may be provided on the first outer cover 17, and when the first outer cover 17 is inserted into the main body 11, a fixed connection is achieved by a pressing force between the first outer cover 17 and the main body 11.

It should be noted that the first outer cover 17 and the main body 11 may be fixedly connected by other means. For example, the first outer cover 17 and the main body 11 may be fixedly connected by glue bonding, and the first outer cover 17 and the main body 11 may also be connected by soldering.

The shapes formed by cross-sectional views of the second end portion 112 and the main body 11 taken along the line B-B or the line C-C may be the same or different. In some embodiments, the second end portion 112 may also be configured to support the electronic device 10 to make it in the standing state, such as the second end portion 112 can be a planar structure or a structure in which a central portion is recessed toward the internal of the electronic device 10. It should be noted that the second end portion 112 may not support the electronic device 10, for example, the second end portion 112 may have a tip shape, and the second end portion 112 may have a structure in which the central portion protrudes toward the external of the electronic device 10.

The shapes formed by the cross-sectional views of the second end portion 112 and the main body 11 taken along the line B-B or the line C-C may be parallel or not parallel.

In some embodiments, referring to FIG. 6 and FIG. 7, the main body 11 may have a second opening 1121 at the second end portion 112. Components of the electronic device 10, such as the first electroacoustic assembly 12, the second electroacoustic assembly 13, the main board 15, the battery 16, and the like, may be received into the receiving cavity 114 of the main body 11 through the second opening 1121. It should be noted that the main body 11 may not be provided with the second opening 1121 at the second end portion 112, for example, the main body 11 is closed at the second end portion 112.

In some embodiments, referring to FIG. 2, the electronic device 10 may further include a second outer cover 18, which is configured to cover and close the second opening 1121. The second outer cover 18 can be inserted into the main body 11 and fixedly connected to an inner surface of the main body 11. Referring to FIG. 7, the inner surface of the main body 11 is provided with a second limiting step 1108 for limiting the second outer cover 18. A portion of the second outer cover 18 is inserted into the main body 11, while another portion of the second outer cover 18 is placed on the second limiting step 1108. It should be noted that the second outer cover 18 may also be entirely placed on the second limiting step 1108. It also should be noted that the main body 11 may not be provided with the second limiting step 1108, and the second outer cover 18 is directly inserted into the main body 11 to form a fixed connection.

The second limiting step 1108 may surround the inner surface of the main body 11. The second limiting step 1108 may also be one or more groove structures formed by recessing from the inner surface of the main body 11. Correspondingly, the second outer cover 18 may have one or more protruding structures disposed in the one or more groove structures, the protruding structure abuts against a bottom wall of the groove structure to achieve the restriction of the second outer cover 18. The second outer cover 18 can be restrained by the groove structure, in the direction from the internal toward the external of the main body 11. For example, the second outer cover 18 can be restrained in the direction from an outer surface toward the inner surface of the main body 11 by the groove structure. For another example, the second outer cover 18 can be restrained in the direction from the internal of the main body 11 toward the second opening 1121.

It should be noted that the embodiment of the disclosure is not limited to inserting at least a portion of the second outer cover 18 into the main body 11 to achieve a fixed connection between the second outer cover 18 and the main body 11. For example, please refer to FIG. 13 and FIG. 14, the second outer cover 18 may also be disposed on a periphery of the main body 11 and fixedly coupled to the outer surface of the main body 11. The second limiting step 1108 can also be provided on the outer surface of the main body 11, that is, the outer surface of the main body 11 forms the second limiting step 1108 for limiting the second outer cover 18. It should be noted that the main body 11 may not provide the second limiting step 1108, and the second outer cover 18 is directly sleeved on the periphery of the main body 11 to achieve the fixed connection.

In some embodiments, the second outer cover 18 can be coupled to the main body 11 in a detachable manner. Thus, when it is necessary to replace or repair the components received in the main body 11, the second outer cover 18 can be opened for replacement or overhaul.

For example, the second outer cover 18 and the main body 11 are fixedly connected in a manner of screwing. An outer surface of the second outer cover 18 is provided with external screw threads, the inner surface of the main body 11 is provided with internal screw threads, and the second outer cover 18 is fixedly coupled to the main body 11 by screwing the external screw threads of the second outer cover 18 with the internal screw threads of the main body 11. It should be noted that, an inner surface of the second outer cover 18 may be provided with external screw threads, and the outer surface of the main body 11 may be provided with external screw threads, and the second outer cover 18 is fixedly coupled to the main body 11 by screwing the external screw threads of the second outer cover 18 with the internal screw threads of the main body 11.

For another example, the second outer cover 18 is fixedly coupled to the main body 11 in a fastening manner. The second outer cover 18 is provided with a number of first buckles, the main body 11 is provided with a number of second buckles, and the second outer cover 18 is fixedly coupled to the main body 11 by the engagement of the first buckles and the second buckles.

For another example, the second outer cover 18 and the main body 11 are fixedly connected in an articulated manner. A hinge pin is provided between the second outer cover 18 and the main body 11 to perform a connection therebetween.

For another example, the second outer cover 18 and the main body 11 are fixedly connected by means of plugging. A chamfered structure may be provided on the second outer cover 18, and when the second outer cover 18 is inserted into the main body 11, a fixed connection is achieved by a pressing force between the second outer cover 18 and the main body 11.

It should be noted that the second outer cover 18 and the main body 11 may be fixedly connected by other means. For example, the second outer cover 18 and the main body 11 may be fixedly connected by glue bonding, and the second outer cover 18 and the main body 11 may also be connected by soldering.

In some embodiments, at least one of the first end portion 111 and the second end portion 112 is used to support the electronic device 10. For example, the first end portion 111 can support the electronic device 10, the second end portion 112 does not support the electronic device 10, the first end portion 111 can be the bottom of the electronic device 10, and the second end portion 112 can be the top of the electronic device 10. For another example, the first end portion 111 does not support the electronic device 10, the second end portion 112 can support the electronic device 10, the first end portion 111 can be the top of the electronic device 10, and the second end portion 112 can be the bottom of the electronic device 10. For example, the first end portion 111 can support the electronic device 10, and the second end portion 112 can support the electronic device 10, that is, both of the first end portion 111 and the second end portion 112 can support the electronic device 10.

In some embodiments, the first end portion 111 and the second end portion 112 may be parallel to each other or not parallel to each other. The first end portion 111 and the second end portion 112 may be equally sized or unequally sized.

In some embodiments, the first end 111 and the second end 112 of the main body 11 can form at least one opening to facilitate mounting the components into the main body 11. For example, the main body 11 defines the first opening 1111 at the first end portion 111, and does not define the second opening 1121 at the second end portion 112. For another example, the main body 11 does not define the first opening 1111 at the first end portion 111, but defines the second opening 1121 at the second end portion 112. For another example, the main body 11 defines the first opening 1111 at the first end portion 111 and the second opening 1121 at the second end portion 112. It should be noted that the main body 11 may not define the first opening 1111 at the first end portion 111 and the second opening 1121 at the second end portion 112. The main body may adopt two parts structure, or define an opening at the side portion 113 to mount the components of the electronic device into the main body 11.

The side portion 113 may have a cylindrical structure or a conical structure, and the side portion 113 may also have at least two connected surfaces. When the side portion 113 has two connected surfaces, at least one of the connected surfaces is a curved surface. For example, the side portion 113 includes a curved surface and a flat surface, for another example, the side portion 113 includes two curved surfaces. When the side portion 113 has at least three connected surfaces, all surfaces of the side portions 113 may be curved surfaces, or flat surfaces, or include at least one curved surface and at least one flat surface connected therewith.

In some embodiments, referring to FIG. 6, the main body 11 may have a transparent area 115, which may be formed by a window formed on the main body 11, thereby the internal of the electronic device 10 may be watched from the external of the electronic device 10 through the transparent area 115.

In some embodiments, referring to FIG. 1 and FIG. 4, the electronic device 10 may be provided with a transparent cover 141 on the transparent area 115, and the transparent cover 141 may be a cover glass.

Figure 15:
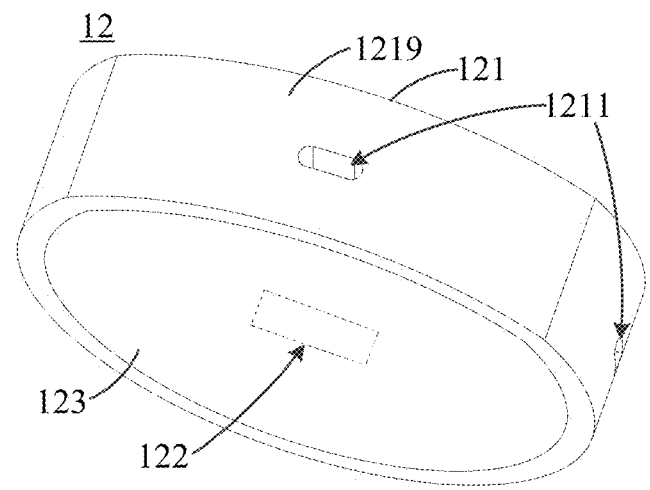
FIG. 15 is a schematic structural view of a first electroacoustic assembly in the electronic device shown in FIG. 2.
Figure 16:
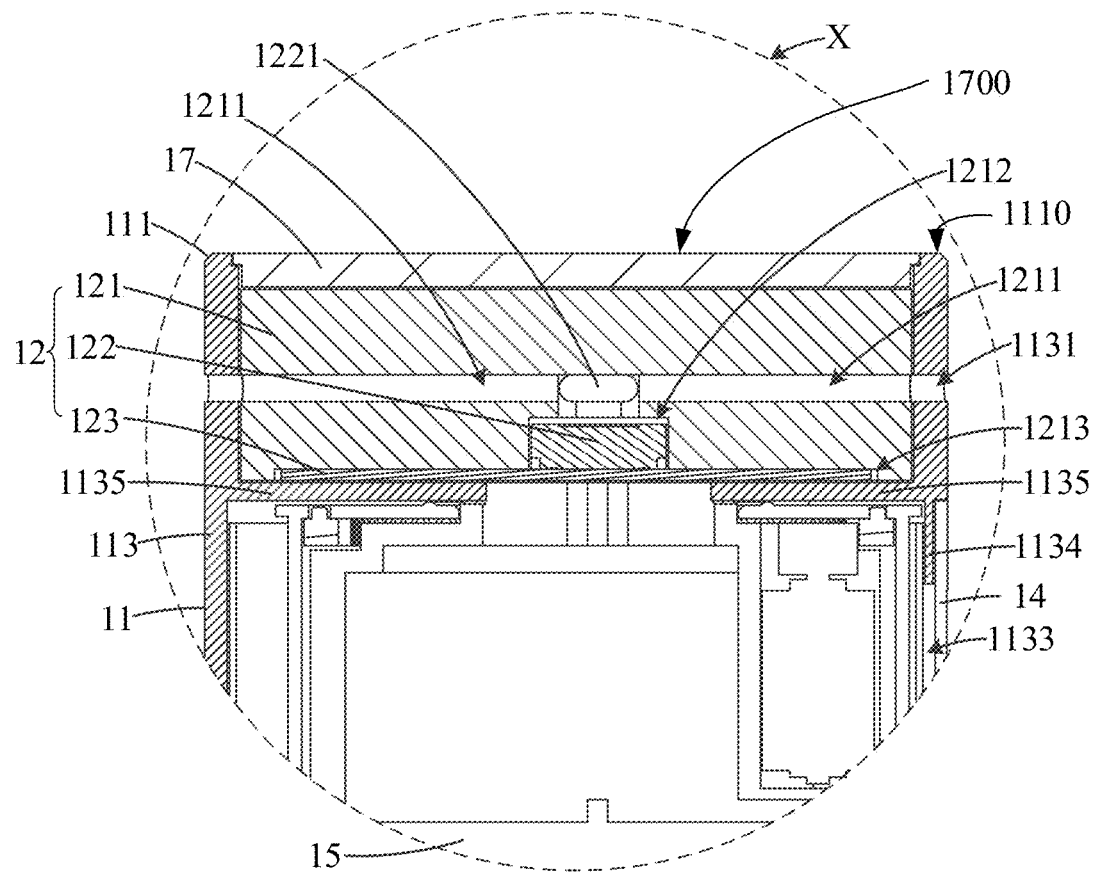
FIG. 16 is a partially enlarged schematic view of the electronic device shown in FIG. 2.

Please refer to FIG. 15 and FIG. 16, FIG. 15 is a schematic structural diagram of the first electroacoustic assembly in the electronic device shown in FIG. 2, FIG. 16 is a partially enlarged schematic view of the X region of the electronic device as shown in FIG. 2. The first electroacoustic assembly 12 can include a first electroacoustic carrier 121, a first electroacoustic component 122, and a first electroacoustic circuit board 123. The first electroacoustic component 122 and the first electroacoustic circuit board 123 may be disposed on the first electroacoustic carrier 121, and the first electroacoustic component 122 is coupled to the first electroacoustic circuit board 123. The first electroacoustic component 122 can transmit sound signals through the first electroacoustic carrier 121.

The electronic device 10 also may be positioned in the standing state by the supporting of the first outer cover 17, or by the supporting of the first end portion 111 and the first outer cover 17 together. That is, as illustrated in FIG. 16, the first outer cover 17 may include a first supporting surface 1700, and the first end portion 111 may include a second supporting surface 1110, the first supporting surfaces 1700 and the second supporting surface 1110 are flat and coplanar, thereby together forming a supporting surface to enable the electronic device 10 to keep in the standing state. A central axis of the electronic device 10 is perpendicular to the supporting surface, in the standing state.

Figure 17:
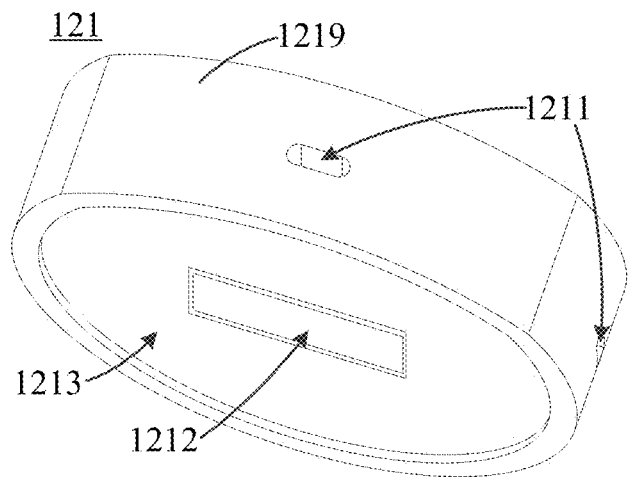
FIG. 17 is a schematic structural view of a first electroacoustic carrier in the electronic device shown in FIG. 2.

Please refer to FIG. 17, which is a schematic structural diagram of the first electroacoustic carrier in the electronic device shown in FIG. 2. The first electroacoustic carrier 121 can serve as a carrier for the first electroacoustic assembly 12 and can form an outer contour of the first electroacoustic component 12. The first electroacoustic carrier 121 may have a regular shape, and the first electroacoustic carrier 121 may be a columnar structure such as a cylindrical structure, a truncated cone structure, a conical structure, a polyhedral structure, or the like. It should be noted that the first electroacoustic carrier 121 may also have an irregular shape.

Figure 18:
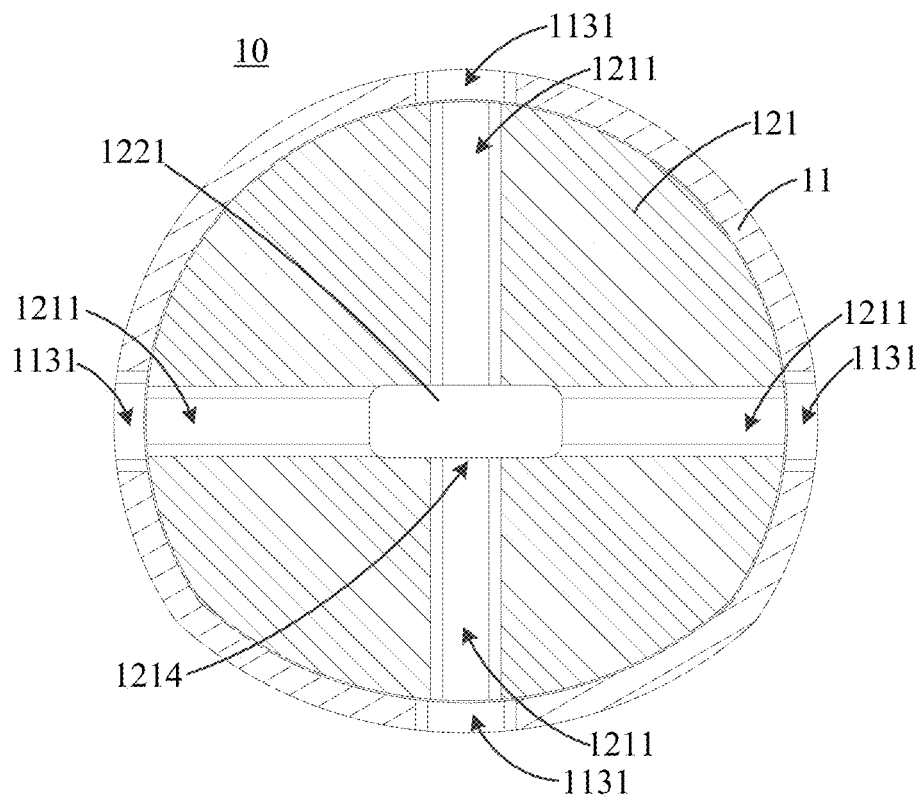
FIG. 18 is a cross-sectional view of the electronic device of FIG. 1 in the C-C direction.

Referring to FIG. 18, which is a cross-sectional view of the electronic device shown in FIG. 1 taken along the line C-C. When the first electroacoustic carrier 121 is a cylindrical structure, a truncated cone structure or a cone structure, the cross-sectional view of the first electroacoustic carrier 121 taken along the line C-C can form a circle, in other words, the cross-sectional view of the first electroacoustic carrier 121 is circular.

When the first electroacoustic carrier 121 is a polyhedral structure, the cross-sectional view of the first electroacoustic carrier 121 taken along the line C-C may form a polygon, in other words, the cross-section of the first electroacoustic carrier 121 may be a polygon. The polygon formed by the cross-sectional view of the first electroacoustic carrier 121 taken along the line C-C may be a triangle, a quadrangle, a pentagon, a hexagon or the like.

When the polygon formed by the the cross-sectional view of the first electroacoustic carrier 121 taken along the line C-C includes at least two sides, one may be a curved side while the other may be a straight side, details are shown in FIG. 11 and not described here.

Figure 8:
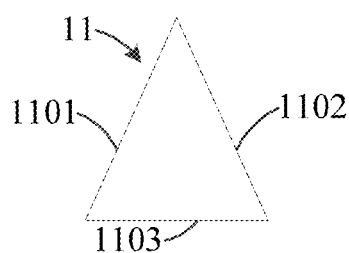
FIG. 8 is a first cross-sectional view of the main body of the electronic device in the B-B direction or the C-C direction.

When the polygon formed by the he cross-sectional view of the first electroacoustic carrier 121 taken along the line C-C is a triangle, a quadrangle, a pentagon, a hexagon or the like, that is, the polygon includes at least three sides, the at least three sides each can be a straight side, and two of the at least three sides can have the same length, referring to FIG. 8. In another embodiment, all straight sides can have the same length, detailed are shown in FIG. 9 and not described here. In another embodiment, all straight sides can have different lengths, details are shown in FIG. 10. The at least three sides may include at least one curved side, or the at least three sides each are curved side, details are shown in FIG. 12.

In some embodiments, the first electroacoustic carrier 121 can be corresponding to the inner surface of the main body 11. It should be noted that the first electroacoustic carrier 121 may not be corresponding to the inner surface of the main body 11.

The first electroacoustic carrier 121 can be made of a plastic material. It should be noted that the first electroacoustic carrier 121 may also adopt other materials, such as metal, foam, or the other.

In some embodiments, the first electroacoustic carrier 121 can have a first side surface 1219 and two end surfaces, the first side surface 1219 is located between the two end surfaces of the first electroacoustic carrier 121. The first side surface 1219 may just one, for example, the first side surface 1219 can be a cylindrical surface. The first side surface 1219 may also be more than one, and the more than one first side surfaces 1219 are connected with each other. The cross-sections of the first side surface 1219 and the first electroacoustic carrier 121 may be the same. Details can be referred to the above and not describe herein again.

In some embodiments, the first electroacoustic carrier 121 is provided with at least two first electroacoustic channels 1211, and the at least two first electroacoustic channels 1211 communicate the interior and the exterior of the first electroacoustic carrier 121. The at least two first electroacoustic channels 1211 are communicated with the first electroacoustic component 122. The first electroacoustic component 122 can transmit sound signals through the at least two first electroacoustic channels 1211. Thus, the first electroacoustic component 122 can realize multi-directional transmission for sound signals, and the first electroacoustic component 122 can transmit sound signals in multiple directions for a number of users.

The at least two first electroacoustic channels 1211 may be two, three, four or more.

In some embodiments, the at least two first electroacoustic channels 1211 are spaced apart in the direction around the first side surface 1219. The at least two first electroacoustic channels 1211 may be equally spaced in the direction around the first side surface 1219, and the distance between every two adjacent first electroacoustic channels 1211 on the first side surface 1219 may be the same, and the straight line distance between every two adjacent first electroacoustic channels 1211 is also the same. It should be noted that the distance between every two adjacent first electroacoustic channels 1211 on the first side surface 1219 may be unequal.

In some embodiments, the depths of the at least two first electroacoustic channels 1211 can be the same. Therefore, the distances, for transmitting the sound signals from the first electroacoustic component 122 through the respective first electroacoustic channels 1211, are equal. The first electroacoustic component 122 can simultaneously transmit the sound signals through the respective first electroacoustic channels 1211, thereby to synchronize the transmission of the sound signals. It should be noted that the depths of the first electroacoustic channels 1211 may also be unequal.

In some embodiments, the at least two first electroacoustic channels 1211 may form a first junction 1214 in the first electroacoustic carrier 121, and the first electroacoustic component 122 may be in communication with the first junction 1214, so that the first electroacoustic component 122 can transmit sound signals from the first junction 1214 through the respective first electroacoustic channels 1211, respectively. In the embodiment of the disclosure, the at least two first electroacoustic channels 1211 may include four first electroacoustic channels 1211, and the four first electroacoustic channels 1211 intersect with each other to form a cross and the first junction 1214 at a central portion of the four first electroacoustic channels 1211. When the first electroacoustic carrier 121 has a cylindrical structure, the first junction 1214 is located at a central axis of the first electroacoustic carrier 121, in other words, at an intersection where the line A-A intersects the line C-C.

In some embodiments, the at least two first electroacoustic channels 1211 may be located at an intermediate position of the first electroacoustic carrier 121, that is, the at least two first electroacoustic channels 1211 are located between the two end surfaces of the first electroacoustic carrier 121. In other words, the at least two first electroacoustic channels 1211 are disposed along the section line C-C. When the first electroacoustic carrier 121 has a cylindrical structure, each of the first electroacoustic channels 1211 is disposed along a radial direction of the first electroacoustic carrier 121. It should be noted that each of the first electroacoustic channels 1211 may also be disposed offset from each other.

When there are a number of first side surfaces 1219, the at least two first electroacoustic channels 1211 are located at different first side surfaces 1219. When the number of the first side surfaces 1219 is three or more, one of the at least two first electroacoustic channels 1211 may be disposed at one of the first side surfaces 1219, and another one of the at least two first electroacoustic channels 1211 may be disposed at another one of the first side surfaces 1219. It should be noted that when the number of the first side surfaces 1219 is more than one, the number of the at least two first electroacoustic channels 1211 may be equal to the number of the first side surfaces 1219, and each first electroacoustic channel 1211 is disposed at one corresponding first side surface 1219, that is, each of the first side surfaces 1219 has one corresponding first electroacoustic channel 1211.

The first electroacoustic carrier 121 can be formed by mechanical processing or injection molding. After the first electroacoustic carrier 121 is formed, the first electroacoustic component 122 and the first electroacoustic circuit board 123 may be disposed on the first electroacoustic carrier 121, and the first electroacoustic component 122 and the first electroacoustic circuit board 123 may be disposed on two end surfaces of the first electroacoustic carrier 121.

Referring to FIG. 16, the first electroacoustic component 122 and the first electroacoustic circuit board 123 may be disposed at the same end of the first electroacoustic carrier 121. Referring to FIG. 17, a first receiving recess 1212 and a first placing recess 1213 may be provided at one end of the first electroacoustic carrier 121. The first receiving recess 1212 communicates with the first placing recess 1213, and the first receiving recess 1212 is formed at a bottom wall of the first placing recess 1213. The first receiving recess 1212 is in communication with each of the first electroacoustic channels 1211, and the first receiving recess 1212 is located between the first placing recess 1213 and the first electroacoustic channel 1211.

Figure 19:
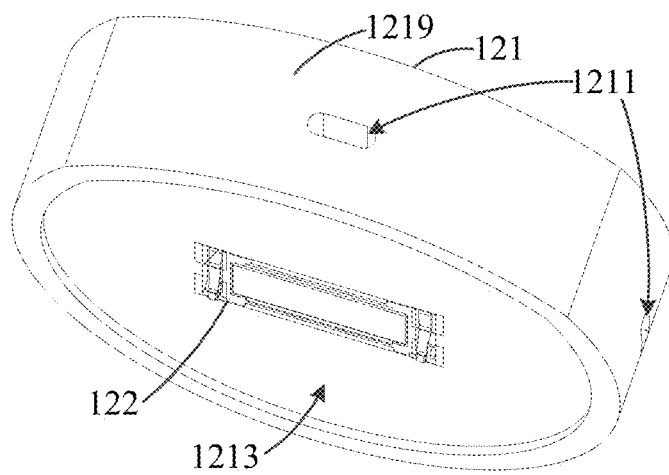
FIG. 19 is a schematic structural view showing a first electroacoustic component fixed on the first electroacoustic carrier of the electronic device shown in FIG. 2.

The first receiving recess 1212 is configured to receive the first electroacoustic component 122, and the first placing recess 1213 is configured to place the first electroacoustic circuit board 123. In other words, the first electroacoustic component 122 can be placed in the first receiving recess 1212, and the first electroacoustic circuit board 123 can be placed in the first placing recess 1213. Please refer to FIG. 19, which is a schematic diagram showing the first electroacoustic component is fixedly attached to the first electroacoustic carrier in the electronic device shown in FIG. 2.

It should be noted that, the way the first electroacoustic carrier 121 sets the first electroacoustic device 122 and the first electroacoustic circuit board 123 is not limited thereto.

Figure 20:
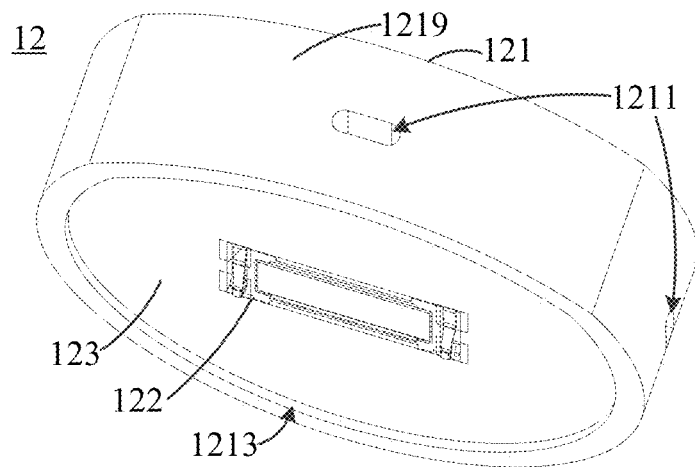
FIG. 20 is another schematic structural view of the first electroacoustic assembly of the electronic device according to an embodiment of the present disclosure.
Figure 21:
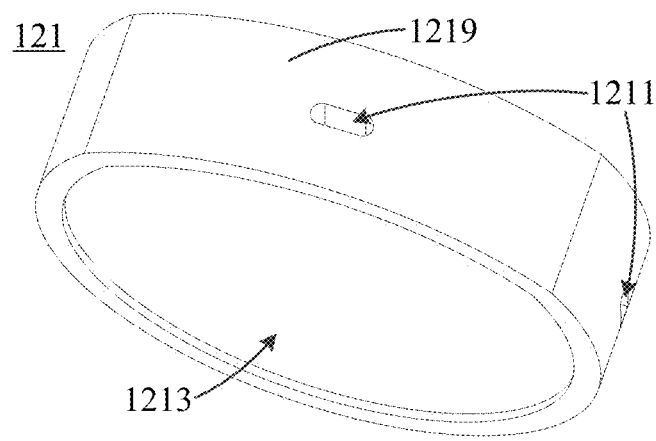
FIG. 21 is a schematic structural view of the first electroacoustic carrier in the first electroacoustic assembly shown in FIG. 20.

For example, please refer to FIG. 20 and FIG. 21, FIG. 20 is another schematic structural diagram of a first electroacoustic assembly, and FIG. 21 is a structural schematic view of a first electroacoustic carrier of the first electroacoustic assembly shown in FIG. 20. The differences between the first electroacoustic assembly 12 shown in FIG. 20 and the first electroacoustic assembly shown in FIG. 15 are as follows: the first electroacoustic carrier 121 of the first electroacoustic assembly 12 shown in FIG. 20 is provided with a first placing recess 1213 at one end of the first electroacoustic carrier 121, and the first electroacoustic circuit board 123 and the first electroacoustic component 122 are both placed in the first placing recess 1213. The first electroacoustic component 122 can be disposed on the first electroacoustic circuit board 123, and through holes can be formed in the first electroacoustic circuit board 123 to communicate the first electroacoustic component 122 and each of the first electroacoustic channels 1211. The first electroacoustic circuit board 123 is located between the other end of the first electroacoustic carrier 121 and the first electroacoustic component 122, it means that, the first electroacoustic circuit board 123 is located between the first electroacoustic component 122 and the first electroacoustic channels 1211.

For example, the first electroacoustic carrier 121 does not define the first receiving recess 1212 and the first placing recess 1213, and the first electroacoustic component 122 and the first electroacoustic circuit board 123 can be directly fixed at the same end of the first electroacoustic carrier 121.

It should be noted that the first electroacoustic component 122 and the first electroacoustic circuit board 123 may also be disposed at two ends of the first electroacoustic carrier 121. The first electroacoustic circuit board 123 and the first electroacoustic component 122 may also be respectively received at two recesses defined at two ends of the first electroacoustic carrier 121. For example, one end of the first electroacoustic carrier 121 defines a first receiving recess 1212 for receiving the first electroacoustic device 122, the other end of the first electroacoustic carrier 121 defines a first placing recess 1213 for receiving the first electroacoustic circuit board 123. It should also be noted that the first electroacoustic component 122 and the first electroacoustic circuit board 123 may be directly fixed at the two ends of the first electroacoustic carrier 121.

It should be noted that the first electroacoustic component 122 can also be disposed inside the first electroacoustic carrier 121, such as the first electroacoustic component 122 is positioned at the first junction 1214 and surrounded by the first electroacoustic carrier 121, and the first electroacoustic circuit board 123 is disposed at one end of the first electroacoustic carrier 121.

The first electroacoustic component 122 can include a receiver, and the receiver can transmit the sound signals from the internal to the external of the first electroacoustic carrier 121 through the at least two first electroacoustic channels 1211. The receiver can be disposed in the first receiving recess 1212, and a diaphragm 1221 of the receiver can be disposed at the first junction 1214, as shown in FIGS. 16 and 18. It should be noted that the first electroacoustic component 122 is not limited to the receiver, in some embodiments, the first electroacoustic component 122 may include a microphone, the first electroacoustic component 122 may also include a receiver and a microphone.

It should be noted that the first electroacoustic assembly 12 can exist independently from the electronic device 10, and the first electroacoustic assembly 12 can realize the transmission of the sound signals after being powered on. For example, the first electroacoustic assembly 12 can transmit the sound signals to the external.

It can be understood that the first electroacoustic assembly 12 can also transmit sound signals cooperated with other apparatus. For example, the first electroacoustic assembly 12 is installed in the main body 11 of the electronic device 10 of the embodiment of the disclosure, and the first electroacoustic assembly 12 can cooperate with other components in the electronic device 10 to realize the transmission of the sound signals.

In some embodiments, the first electroacoustic assembly 12 serves as a part of the electronic device 10 to transmit sound signals. Specifically, referring to FIG. 2, FIG. 6, FIG. 7 and FIG. 16, the first electroacoustic assembly 12 can be placed into the main body 11 from the first opening 1111, the first electroacoustic circuit board 123 can be coupled to and controlled by the main board 15, and is powered by the battery 16, thereby to enable the first electroacoustic assembly 12 to transmit sound signals.

In some embodiments, the main body 11 is provided with at least two first electroacoustic holes 1131 correspondingly communicated with the at least two first electroacoustic channels 1211. The number of the at least two first electroacoustic holes 1131 is equal to that of the at least two first electroacoustic channels 1211, and the at least two first electroacoustic holes 1131 are communicated with the at least two first electroacoustic channels 1211 one by one. As such, the first electroacoustic component 122 can transmit sound signals from the internal to the external of the electronic device 10 through the at least two first electroacoustic channels 1211 and the at least two first electroacoustic holes 1131.

It should be noted that when the main body 11 is a cylindrical structure, or a truncated cone structure, or the at least two side surfaces of the side portion 113 of the main body 11 are equal, the cross-sectional view shown in FIG. 2 can be formed along the axial direction of the electronic device, the section line A-A can be the central axis of the electronic device 10, and the cross-sectional view shown in FIG. 18 may be formed along the radial direction of the electronic device 10. It can be understood that the axial direction of the electronic device 10 is perpendicular to the radial direction of the electronic device 10, that is, the section line A-A is perpendicular to the section line C-C.

The at least two first electroacoustic holes 1131 may be formed at the side portion 113 of the main body 11, and the at least two first electroacoustic holes 1131 may be defined around the circumference of the main body 11. The at least two first electroacoustic holes 1131 and the first outer cover 17 may be spaced apart, or the at least two first electroacoustic holes 1131 and the first end portion 111 may be spaced apart. It should be noted that the at least two first electroacoustic holes 1131 may also be formed between the first outer cover 17 and the side portion 113.

The at least two first electroacoustic holes 1131 are spaced apart in a direction surrounding the side portion 113. The at least two first electroacoustic holes 1131 may be equally spaced in the direction surrounding the side portions 113, the distance between every two adjacent first electroacoustic holes 1131 on the first side surface 1219 may be the same, and the straight line distance between every two adjacent first electroacoustic holes 1131 is also the same. It should be noted that the distance between every two adjacent first electroacoustic holes 1131 on the first side surface 1219 may be unequal.

In some embodiments, the depths of the at least two first electroacoustic apertures 1131 may be equal, such that the distances for transmitting sound signals from the first electroacoustic component 122 through the respective first electroacoustic channels 1211 and the respective first electroacoustic holes 1131 are equal, the first electroacoustic component 122 can simultaneously transmit sound signals through the respective first electroacoustic channels 1211 and the respective first electroacoustic holes 1131 to synchronically transmit the sound signals. It should be noted that the depths of the first electroacoustic holes 1131 may not be equal.

When the main body 11 has a cylindrical structure, the at least two first electroacoustic holes 1131 are disposed along a radial direction of the main body 11, that means the at least two first electroacoustic holes 1131 are disposed along a cross-sectional direction of the main body 11, or means the at least two first electroacoustic holes 1131 are disposed along the section line C-C. It should be noted that the first electroacoustic holes 1131 may also be offset from each other. The first electroacoustic component 122 may be located at the central axis of the main body 11, in other words, the first electroacoustic component 122 may be located at the section line A-A.

When the cross-section of the main body 11 is a polygon, or when the cross-section of the main body 11 includes several sides, the at least two first electroacoustic holes 1131 each may be located at different sides of the cross-section of the main body 11. In other words, when the side portion 113 has a number of sequentially connected surfaces, the at least two first electroacoustic holes 1131 may be located on different surfaces of the side portions 113.

When the cross-section of the main body 11 is a triangle or a polygon, that is, when the cross-section of the main body 11 forms three or more sides, the first electroacoustic holes 1131 may be provided on at least two sides of the cross-section of the main body 11. Alternatively, when the side portion 113 has three or more mutually connected side surfaces, the first electroacoustic hole 1131 may be provided on at least two side surfaces of the side portion 113. In some embodiments, the first electroacoustic holes 1131 can be provided on the side surfaces of the side portion 113 one by one. It should be noted that when the side portion 113 has a number of connected side surfaces, the number of the at least two first electroacoustic holes 1131 may be equal to the number of the side surfaces of the side portions 113, and each side surface is provided with one corresponding first electroacoustic hole 1131, that is, the side surfaces of the side portion 113 are corresponding to the first electroacoustic holes 1131 one by one.

The cross-section of the main body 11 may be substantially parallel to the first end portion 111 and the second end portion 112. The cross-section of the main body 11 may be formed along the section line C-C or the section line B-B.

In some embodiments, the size of the first electroacoustic holes 1131 is larger than that of the corresponding first electroacoustic channel 1211. For example, the diameter of the first electroacoustic hole 1131 is larger than that of the first electroacoustic channel 1211.

When the first electroacoustic assembly 12 is placed inside the main body 11, the first opening 1111 may be covered by the first outer cover 17. The first outer cover 17 can not only function as a dustproof, but also can protect the first electroacoustic assembly 12. It should be noted that a waterproof ring may be disposed on the periphery of the first outer cover 17 to achieve waterproof.

In some embodiments, after the first electroacoustic assembly 12 is placed inside the main body 11, the first electroacoustic assembly 12 can abut against the inner surface of the main body 11 to achieve a fixed connection between the first electroacoustic assembly 12 and the main body 11. The first electroacoustic assembly 12 can also be secured by a positioning structure disposed in the main body 11. For example, referring to FIG. 7, FIG. 13, FIG. 14 and FIG. 16, the inner surface of the main body 11 may be provided with a first placing plate 1135 for placing the first electroacoustic assembly 12, that is, the first electroacoustic assembly 12 may be placed on the first placing plate 1135, or the first electroacoustic assembly 12 terminates at the first placing plate 1135. So, the first electroacoustic assembly 12 is limited between the first end portion 111 and the first placing plate 1135, in other words, the first electroacoustic assembly 12 is constrained between the first outer cover 17 and the first placing plate 1135, that means the first electroacoustic assembly 12 is constrained at a position adjacent to the first end portion 111. The first electroacoustic assembly 12 can transmit sound signals from the position between the first placing plate 1135 and the first outer cover 17 toward the outside of the electronic device 10, that is, the first electroacoustic assembly 12 is positioned near the first end portion 111 and transmit sound signals toward the external of the electronic device 10.

The first placing plate 1135 can be disposed around the inner surface of the main body 11, and the first placing plate 1135 can also be formed by one or more protruding structures extending from the inner surface of the main body 11.

When the first electroacoustic assembly 12 is placed in the main body 11, the first electroacoustic circuit board 123 can be away from the first end portion 111 to facilitate the connection of the first electroacoustic circuit board 123 and the main board 15. It should be noted that the first electroacoustic circuit board 123 can also be close to the first end portion 111.

It also should be noted that, the first opening 1111 may not be covered by the first outer cover 17, but is directly covered by the first electroacoustic assembly 12. One end of the first electroacoustic assembly 12 may be flush with the first end portion 111 of the main body 11 to cover the first opening 1111. In another embodiment, a portion of the first electroacoustic assembly 12 may protrude out from the main body 11 and cover the first opening 1111 of the first end portion 111.

In some embodiments, the first electroacoustic assembly 12 can include a first connecting portion and a first enclosing portion that are connected with each other, and the first connecting portion and the first enclosing portion can be formed on the first electroacoustic carrier 121. The first connecting portion may be inserted into the main body 11 through the first opening 1111 and fixedly connected to the main body 11. For example, an outer surface of the first connecting portion is provided with external screw threads, the inner surface of the main body 11 is provided with internal screw threads, and the first connecting portion and the main body 11 are fixedly connected by screwing the external screw threads of the first connecting portion with the internal screw threads of the main body 11. The first enclosing portion is configured to cover the first opening 1111. One end of the first enclosing portion may be flush with the first end portion 111, and the first enclosing portion may also be placed on the first end portion 111.

In some embodiments, the first electroacoustic assembly 12 can include a first sleeving portion and a first covering portion that are connected with each other, and the first sleeving portion and the first covering portion can be formed on the first electroacoustic carrier 121. The first sleeving portion may be sleeved on the outer surface of the main body 11 and fixedly connected to the main body 11. For example, an inner surface of the first sleeving portion is provided with internal screw threads, the outer surface of the main body 11 is provided with external screw threads, and the first sleeving portion and the main body 11 are fixedly connected by screwing the external screw threads of the main body 11 with the internal screw threads of the first sleeving portion. The first covering portion is configured to cover the first opening 1111.

In some embodiments, after the first electroacoustic assembly 12 is placed inside the main body 11, the first electroacoustic assembly 12 can cover the first opening 1111 and be directly connected to the inner surface of the main body 11 by screwing, snapping, plugging or the like.

It should be noted that the first electroacoustic assembly 12 is not limited to be placed between the first placing plate 1135 and the first outer cover 17, and can also be placed at other locations of the main body 11. For example, the first electroacoustic assembly 12 is disposed at a central position of the main body 11 or at a position close to the central position of the main body 11.

Figure 22:
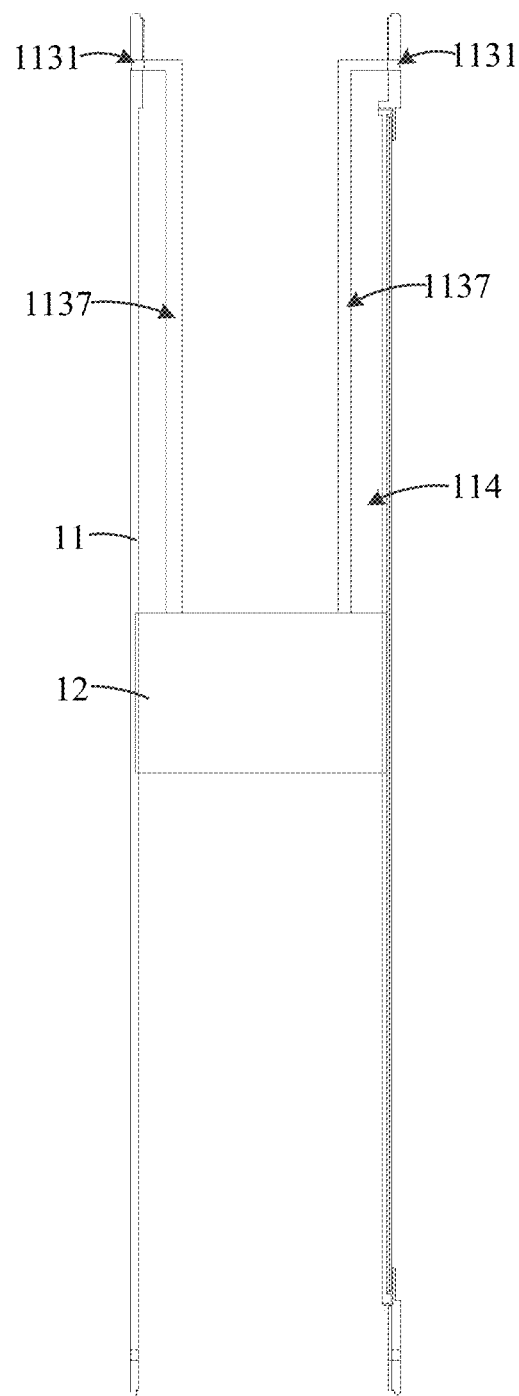
FIG. 22 is a schematic diagram showing the first electroacoustic assembly cooperated with a portion of the main body in an electronic device according to an embodiment of the disclosure.

Referring to FIG. 22, which is a schematic diagram showing the cooperation of the first electroacoustic assembly and the main body in the electronic device according to an embodiment of the disclosure. The first electroacoustic assembly 12 can be disposed at an intermediate position of the main body 11. The main body 11 is provided with at least two first transmission channels 1137, and the at least two first transmission channels 1137 are respectively connected to the at least two first electroacoustic channels 1211 and the at least two first electroacoustic holes 1131. Therefore, the first electroacoustic component 122 can transmit the sound signals through the at least two first electroacoustic channels 1211, the at least two first transmission channels 1137, and the at least two first electroacoustic holes 1131. For example, the first electroacoustic component 122 can transmit sound signals to the outside of the main body 11 through the at least two first electroacoustic channels 1211, the at least two first transmission channels 1137, and the at least two first electroacoustic holes 1131.

Figure 23:
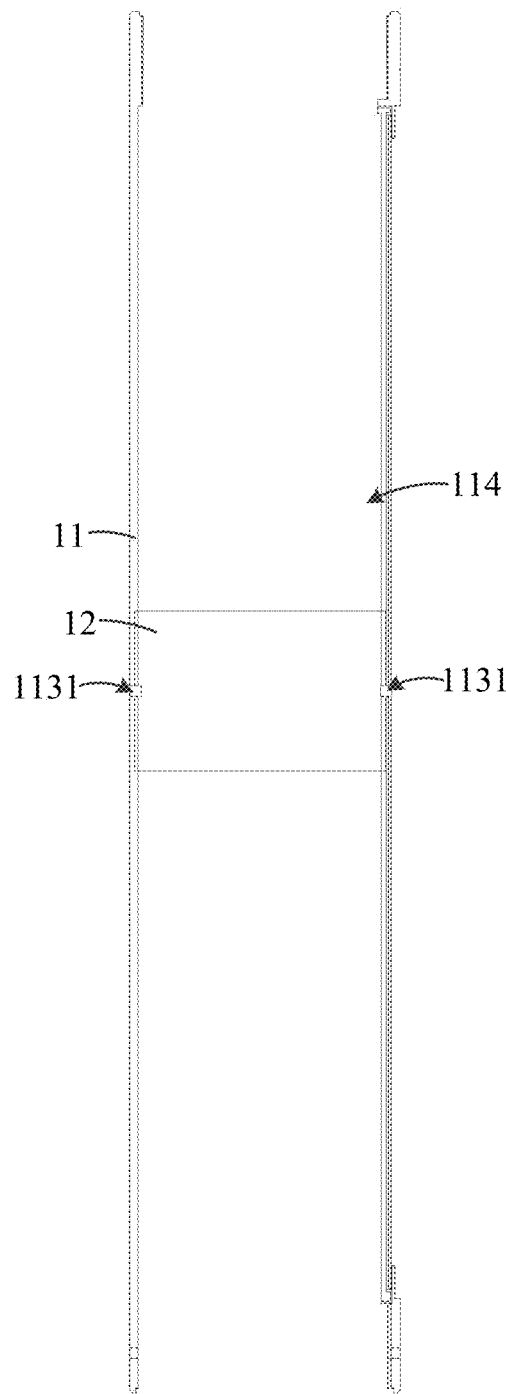
FIG. 23 is another schematic diagram showing the first electroacoustic assembly cooperated with a portion of the main body in an electronic device according to an embodiment of the disclosure.

Referring to FIG. 23, FIG. 23 is another schematic diagram showing the cooperation of the first electroacoustic assembly and a portion of the main body in an electronic device according to an embodiment of the disclosure. The differences between the FIG. 22 and FIG. 23 are as follows: the at least two first electroacoustic holes 1131 can be disposed at an intermediate position of the main body 11, that is, the at least two first electroacoustic holes 1131 are disposed at a connection position of the main body 11 and the first electroacoustic assembly 12. As such, the at least two first electroacoustic channels 1211 on the first electroacoustic assembly 12 can be directly in communication with the at least two first electroacoustic holes 1131. The first electroacoustic component 122 can transmit sound signals through the at least two first electroacoustic channels 1211 and the at least two first electroacoustic holes 1131.

It should be noted that the first electroacoustic assembly 12 can also be disposed at other positions of the main body 11 and will not be exemplified herein.

Figure 24:
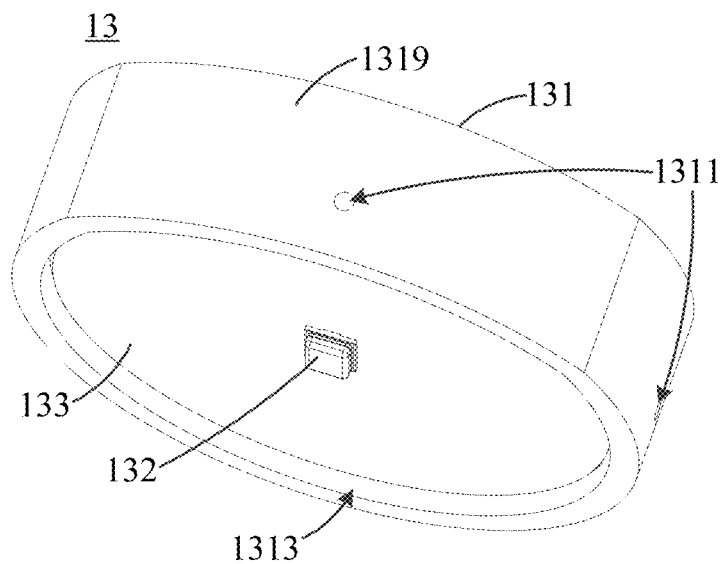
FIG. 24 is a schematic structural diagram of a second electroacoustic assembly in the electronic device shown in FIG. 2.
Figure 25:
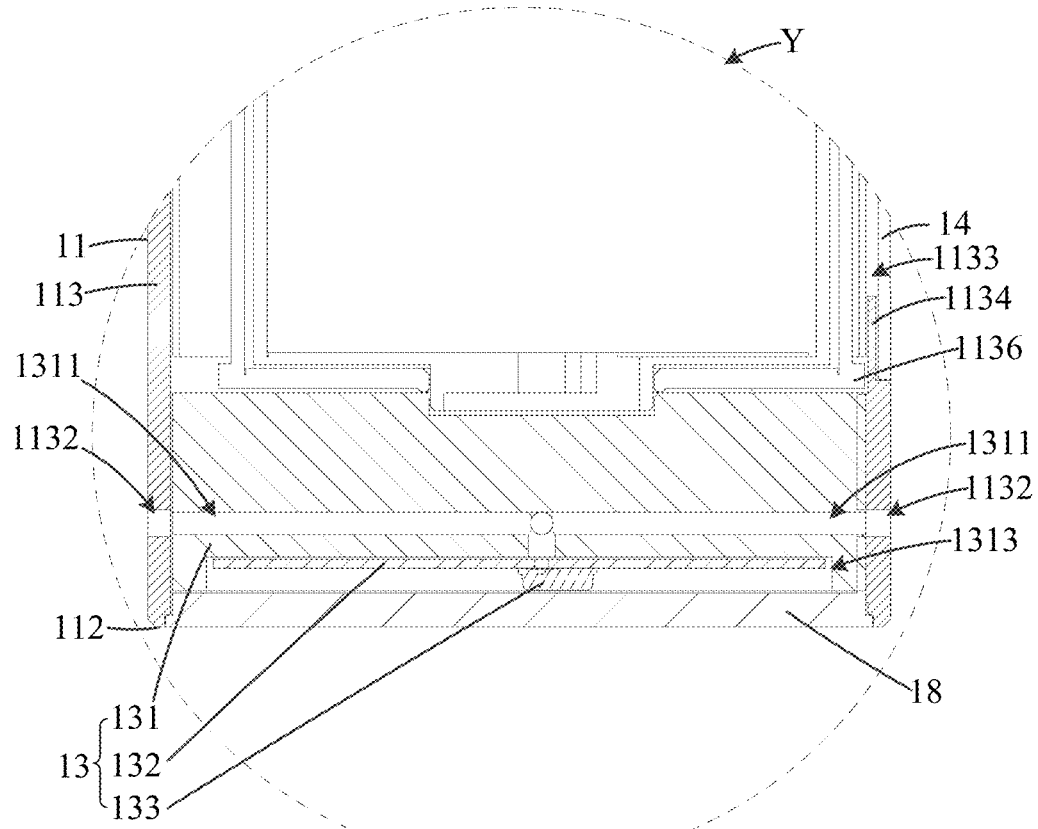
FIG. 25 is a partially enlarged schematic view of the electronic device shown in FIG. 2.

Referring to FIG. 24 and FIG. 25, FIG. 24 is a schematic structural diagram of the second electroacoustic assembly in the electronic device shown in FIG. 2, FIG. 25 is a partially enlarged schematic view of the Y region of the electronic device shown in FIG. 2. The second electroacoustic assembly 13 may include a second electroacoustic carrier 131, a second electroacoustic component 132, and a second electroacoustic circuit board 133. The second electroacoustic component 132 and the second electroacoustic circuit board 133 may be disposed on the second electroacoustic carrier 121, and the second electroacoustic component 132 is coupled to the second electroacoustic circuit board 133. The second electroacoustic component 132 can transmit the sound signals through the second electroacoustic carrier 131.

Figure 26:
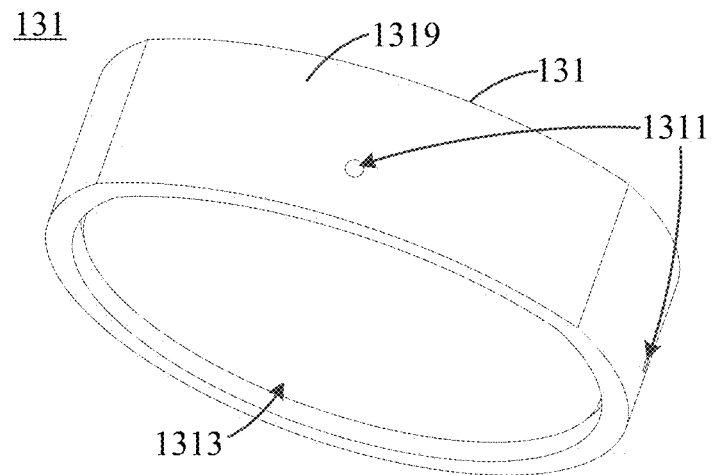
FIG. 26 is a schematic structural view of a second electroacoustic carrier in the electronic device shown in FIG. 2.

Please refer to FIG. 26, which is a schematic structural diagram of the second electroacoustic carrier in the electronic device shown in FIG. 2. The second electroacoustic carrier 131 can serve as a carrier for the second electroacoustic assembly 13 and can form an outer contour of the second electroacoustic assembly 13. The second electroacoustic carrier 131 may have a regular shape, may be a columnar structure, such as a cylindrical structure, a truncated cone structure, a cone structure, a polyhedral structure, or the like. It should be noted that the second electroacoustic carrier 131 may also have an irregular shape.

Figure 27:
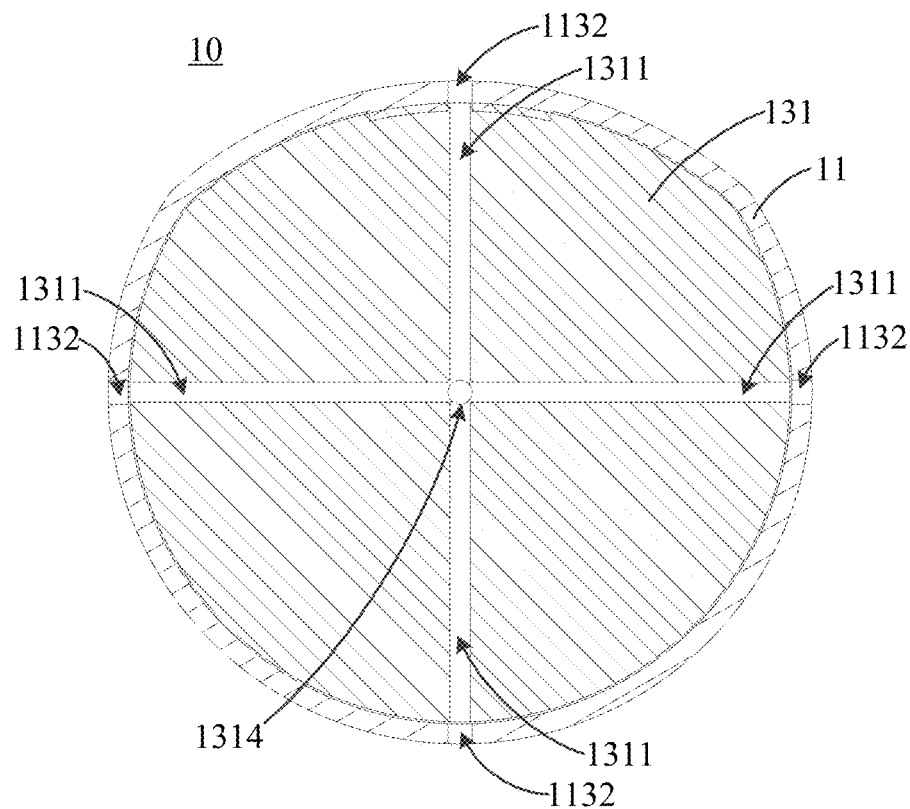
FIG. 27 is a cross-sectional view of the electronic device of FIG. 1 taken along the line B-B.

Please refer to FIG. 27, which is a cross-sectional view of the electronic device of FIG. 1 taken along the section line B-B. When the second electroacoustic carrier 131 is a cylindrical structure, a truncated cone structure or a cone structure, the cross-sectional view of the second electroacoustic carrier 131 taken along the section line B-B may form a circle, in other words, the cross-section of the second electroacoustic carrier 131 is circular.

When the second electroacoustic carrier 131 is a polyhedral structure, the cross-sectional view of the second electroacoustic carrier 131 taken along the line B-B may form a polygon, in other words, the cross-section of the second electroacoustic carrier 131 may be a polygon. The polygon formed by the cross-sectional view of the second electroacoustic carrier 131 taken along the line B-B may be a triangle, a quadrangle, a pentagon, a hexagon or the like.

When the polygon formed by the he cross-sectional view of the second electroacoustic carrier 131 taken along the line B-B includes at least two sides, one may be a curved side while the other may be a straight side, details are shown in FIG. 11 and not described here.

When the polygon formed by the he cross-sectional view of the second electroacoustic carrier 131 taken along the line B-B is a triangle, a quadrangle, a pentagon, a hexagon or the like, that is, the polygon includes at least three sides, the at least three sides each can be a straight side, and two of the at least three sides can have the same length, referring to FIG. 8. In another embodiment, all straight sides can have the same length, detailed are shown in FIG. 9 and not described here. In another embodiment, all straight sides can have different lengths, details are shown in FIG. 10. The at least three sides may include at least one curved side, or the at least three sides each are curved side, details are shown in FIG. 12.

In some embodiments, the second electroacoustic carrier 131 can be corresponding to the inner surface of the main body 11. It should be noted that the second electroacoustic carrier 131 may not be corresponding to the inner surface of the main body 11.

The second electroacoustic carrier 131 can be made of a plastic material. It should be noted that the first electroacoustic carrier 121 may also adopt other materials, such as metal, foam, or the other.

In some embodiments, the second electroacoustic carrier 131 can have a second side surface 1319 and two end surfaces, the second side surface 1319 is located between the two end surfaces of the second electroacoustic carrier 131. The second side surface 1319 may just one, for example, the second side surface 1319 can be a cylindrical surface. The second side surface 1319 may also be more than one, and the more than one second side surfaces 1319 are connected with each other. The cross-sections of the second side surface 1319 and the second electroacoustic carrier 131 may be the same. Details can be referred to the above and not describe herein again.

In some embodiments, the second electroacoustic carrier 131 is provided with at least two second electroacoustic channels 1311, and the at least two second electroacoustic channels 1311 communicate the interior and the exterior of the second electroacoustic carrier 131. The at least two second electroacoustic channels 1311 are communicated with the second electroacoustic component 132. The second electroacoustic component 132 can transmit sound signals through the at least two second electroacoustic channels 1311. Thus, the second electroacoustic component 132 can realize multi-directional transmission for sound signals, and the second electroacoustic component 132 can transmit sound signals in multiple directions for a number of users.

The at least two second electroacoustic channels 1311 may be two, three, four or more.

In some embodiments, the at least two second electroacoustic channels 1311 are spaced apart in the direction around the second side surface 1319. The at least two second electroacoustic channels 1311 may be equally spaced in the direction around the second side surface 1319, and the distance between every two adjacent second electroacoustic channels 1311 on the second side surface 1319 may be the same, and the straight line distance between every two adjacent second electroacoustic channels 1311 is also the same. It should be noted that the distance between every two adjacent second electroacoustic channels 1311 on the second side surface 1319 may be unequal.

In some embodiments, the depths of the at least two second electroacoustic channels 1311 can be the same. Therefore, the distances, for transmitting the sound signals from the second electroacoustic component 132 through the respective second electroacoustic channels 1311, are equal. The second electroacoustic component 132 can simultaneously transmit the sound signals through the respective second electroacoustic channels 1311, thereby to synchronize the transmission of the sound signals. It should be noted that the depths of the second electroacoustic channels 1311 may also be unequal.

In some embodiments, the at least two second electroacoustic channels 1311 may form a second junction 1314 in the second electroacoustic carrier 131, and the second electroacoustic component 132 may be in communication with the second junction 1314, so that the second electroacoustic component 132 can transmit sound signals from the second junction 1314 through the respective second electroacoustic channels 1311, respectively. In the embodiment of the disclosure, the at least two second electroacoustic channels 1311 may include four second electroacoustic channels 1311, and the four second electroacoustic channels 1311 intersect with each other to form a cross and the second junction 1314 at a central portion of the four second electroacoustic channels 1311. When the second electroacoustic carrier 131 has a cylindrical structure, the second junction 1314 is located at a central axis of the second electroacoustic carrier 131, in other words, at an intersection where the line A-A intersects the line B-B.

In some embodiments, the at least two second electroacoustic channels 1311 may be located at an intermediate position of the second electroacoustic carrier 131, that is, the at least two second electroacoustic channels 1311 are located between the two end surfaces of the second electroacoustic carrier 131. In other words, the at least two second electroacoustic channels 1311 are disposed along the section line C-C. When the second electroacoustic carrier 131 has a cylindrical structure, each of the second electroacoustic channels 1311 is disposed along a radial direction of the second electroacoustic carrier 131. It should be noted that each of the second electroacoustic channels 1311 may also be disposed offset from each other.

When there are a number of second side surfaces 1319, the at least two second electroacoustic channels 1311 are located at different second side surfaces 1319. When the number of the second side surfaces 1319 is three or more, one of the at least two second electroacoustic channels 1311 may be disposed at one of the second side surfaces 1319, and another one of the at least two second electroacoustic channels 1311 may be disposed at another one of the second side surfaces 1319. It should be noted that when the number of the second side surfaces 1319 is more than one, the number of the at least two second electroacoustic channels 1311 may be equal to the number of the second side surfaces 1319, and the second electroacoustic channels 1311 are disposed at the second side surfaces 1319 one by one, that is, each of the second side surfaces 1319 has one corresponding second electroacoustic channel 1311.

The second electroacoustic carrier 131 can be formed by mechanical processing or injection molding. After the second electroacoustic carrier 131 is formed, the second electroacoustic component 132 and the first electroacoustic circuit board 123 may be disposed on the second electroacoustic carrier 131, and the second electroacoustic component 132 and the first electroacoustic circuit board 123 may be disposed on two end surfaces of the second electroacoustic carrier 131.

Referring to FIG. 24 and FIG. 25, the second electroacoustic component 132 and the second electroacoustic circuit board 133 may be disposed at the same end of the second electroacoustic carrier 131. A second placing recess 1313 may be provided at one end of the second electroacoustic carrier 131. The second placing recess 1313 is configured to place the second electroacoustic component 132 and the second electroacoustic circuit board 133. The second electroacoustic circuit board 133 can be disposed at a bottom wall of the second placing recess 1313, and the second electroacoustic component 132 can be disposed on the second electroacoustic circuit board 133. When the second electroacoustic component 132 and the second electroacoustic circuit board 133 both are placed in the second placing recess 1313, the second electroacoustic circuit board 133 is positioned between the second electroacoustic component 132 and the second electroacoustic channel 1311. Through holes can be defined in the second electroacoustic circuit board 133 to communicate the second electroacoustic component 132 and every second electroacoustic channel 1311.

It should be noted that, the way the second electroacoustic carrier 131 sets the second electroacoustic component 132 and the second electroacoustic circuit board 133 is not limited thereto.

Figure 28:
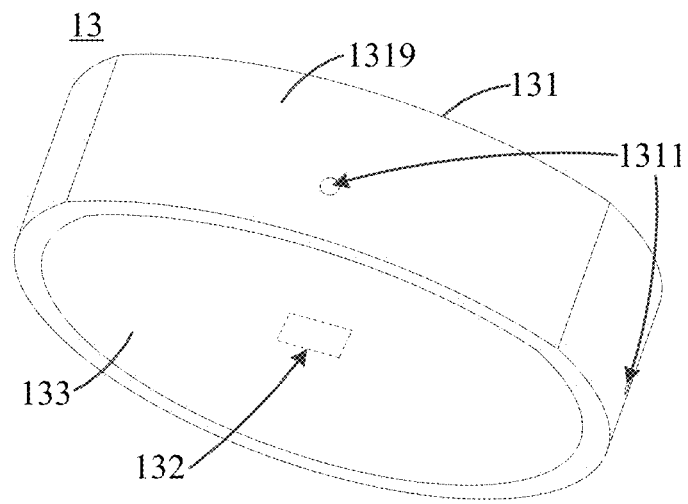
FIG. 28 is another schematic structural diagram of the second electroacoustic assembly of the electronic device according to an embodiment of the present disclosure.
Figure 29:
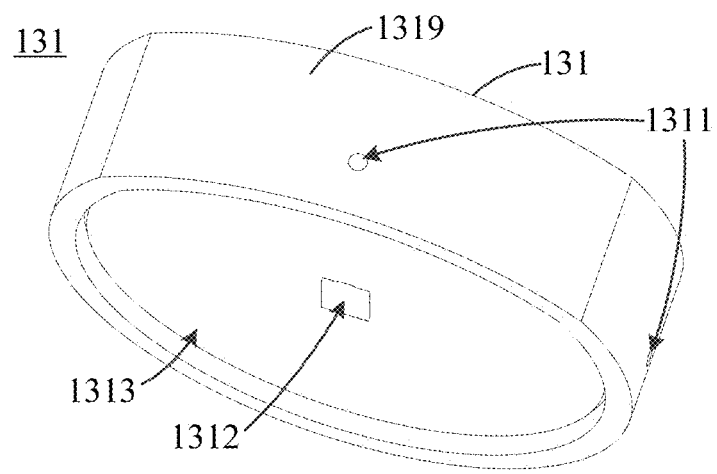
FIG. 29 is a schematic structural view of the second electroacoustic carrier in the second electroacoustic assembly shown in FIG. 28.

For example, please refer to FIG. 28 and FIG. 29, FIG. 28 is another schematic structural diagram of a second electroacoustic assembly, and FIG. 29 is a structural schematic view of a second electroacoustic carrier of the second electroacoustic assembly shown in FIG. 28. A second receiving recess 1312 and the second placing recess 1313 may be provided at one end of the second electroacoustic carrier 131. The second receiving recess 1312 communicates with the second placing recess 1313, and the second receiving recess 1312 is formed at a bottom wall of the second placing recess 1313. The second receiving recess 1312 is in communication with each of the second electroacoustic channels 1311, and the second receiving recess 1312 is located between the second placing recess 1313 and the second electroacoustic channel 1311. The second receiving recess 1312 is configured to receive the second electroacoustic component 132, the second placing recess 1313 is configured to receive the second electroacoustic circuit board 133. In other words, the second electroacoustic component 132 is disposed in the second receiving recess 1312 and the second electroacoustic circuit board 133 is disposed in the second placing recess 1313.

For another example, the second electroacoustic carrier 131 does not define the second receiving recess 1312 and the second placing recess 1313, and the second electroacoustic component 132 and the second electroacoustic circuit board 133 can be directly fixed at the same end of the second electroacoustic carrier 131.

It should be noted that the second electroacoustic component 132 and the second electroacoustic circuit board 133 may also be disposed at two ends of the second electroacoustic carrier 131. The second electroacoustic circuit board 133 and the second electroacoustic component 132 may also be respectively received at two recesses defined at two ends of the second electroacoustic carrier 131. For example, one end of the second electroacoustic carrier 131 defines a second receiving recess 1312 for receiving the first electroacoustic device 122, the other end of the second electroacoustic carrier 131 defines a second placing recess 1313 for receiving the second electroacoustic circuit board 133. It should also be noted that the second electroacoustic component 132 and the second electroacoustic circuit board 133 may be directly fixed at the two ends of the second electroacoustic carrier 131.

It should be noted that the second electroacoustic component 132 can also be disposed inside the second electroacoustic carrier 131, such as the second electroacoustic component 132 is positioned at the second junction 1314 and surrounded by the second electroacoustic carrier 131, and the second electroacoustic circuit board 133 is disposed at one end of the second electroacoustic carrier 131.

The second electroacoustic component 132 can include a receiver, and the receiver can transmit the sound signals from the internal to the external of the second electroacoustic carrier 131 through the at least two second electroacoustic channels 1311. The receiver can be disposed in the second receiving recess 1312 or the second placing recess 1313. It should be noted that the second electroacoustic component 132 is not limited to the receiver, the second electroacoustic component 132 may include a microphone, the second electroacoustic component 132 may also include a receiver and a microphone.

It should be noted that the second electroacoustic assembly 13 can exist independently and be separated from the electronic device 10, and the second electroacoustic assembly 13 can realize the transmission of the sound signals after being powered on. For example, the second electroacoustic assembly 13 can transmit the sound signals from the external to the internal thereof.

It can be understood that the second electroacoustic assembly 13 can also transmit sound signals cooperated with other apparatus. For example, the second electroacoustic assembly 13 is installed in the main body 11 of the electronic device 10 of the embodiment of the disclosure, and the second electroacoustic assembly 13 can cooperate with other components in the electronic device 10 to realize the transmission of the sound signals.

In some embodiments, the second electroacoustic assembly 13 serves as a part of the electronic device 10 to transmit sound signals. Specifically, referring to FIG. 2, FIG. 6, FIG. 7 and FIG. 25, the second electroacoustic assembly 13 can be placed into the main body 11 from the second opening 1211, the second electroacoustic circuit board 133 can be coupled to and controlled by the main board 15, and is powered by the battery 16, thereby to enable the second electroacoustic assembly 13 to transmit sound signals.

In some embodiments, the main body 11 is provided with at least two second electroacoustic holes 1132 correspondingly communicated with the at least two second electroacoustic channels 1311. The number of the at least two second electroacoustic holes 1132 is equal to that of the at least two second electroacoustic channels 1311, and the at least two second electroacoustic holes 1132 are communicated with the at least two second electroacoustic channels 1311 one by one. As such, the second electroacoustic component 132 can transmit sound signals from the external to the internal of the electronic device 10 through the at least two second electroacoustic channels 1311 and the at least two second electroacoustic holes 1132.

It can be understood that the axial direction of the electronic device 10 is perpendicular to the radial direction of the electronic device 10, that is, the section line A-A is perpendicular to the section line B-B.

The at least two second electroacoustic holes 1132 may be formed at the side portion 113 of the main body 11, and the at least two second electroacoustic holes 1132 may be defined around the circumference of the main body 11. The at least two second electroacoustic holes 1132 and the second outer cover 18 may be spaced apart, or the at least two second electroacoustic holes 1132 and the first end portion 111 may be spaced apart. It should be noted that the at least two second electroacoustic holes 1132 may also be formed between the second outer cover 18 and the side portion 113.

The at least two second electroacoustic holes 1132 are spaced apart in a direction surrounding the side portion 113. The at least two second electroacoustic holes 1132 may be equally spaced in the direction surrounding the side portions 113, the distance between every two adjacent second electroacoustic holes 1132 on the second side surface 1319 may be the same, and the straight line distance between every two adjacent second electroacoustic holes 1132 is also the same. It should be noted that the distance between every two adjacent second electroacoustic holes 1132 on the second side surface 1319 may be unequal.

In some embodiments, the depths of the at least two first electroacoustic apertures 1131 may be equal, such that the distances for transmitting sound signals from the second electroacoustic component 132 through the respective second electroacoustic channels 1311 and the respective second electroacoustic holes 1132 are equal. The second electroacoustic component 132 can simultaneously transmit sound signals through the respective second electroacoustic channels 1311 and the respective second electroacoustic holes 1132 to synchronically transmit the sound signals. It should be noted that the depths of the second electroacoustic holes 1132 may not the same.

When the main body 11 has a cylindrical structure, the at least two second electroacoustic holes 1132 are disposed along a radial direction of the main body 11, that means the at least two second electroacoustic holes 1132 are disposed along a cross-sectional direction of the main body 11, or means the at least two second electroacoustic holes 1132 are disposed along the section line B-B. It should be noted that the second electroacoustic holes 1132 may also be offset from each other. The second electroacoustic component 132 may be located at the central axis of the main body 11, in other words, the second electroacoustic component 132 may be located at the section line A-A.

When the cross-section of the main body 11 is a polygon, or when the cross-section of the main body 11 includes several sides, the at least two second electroacoustic holes 1132 each may be located at different sides of the cross-section of the main body 11. In other words, when the side portion 113 has a number of sequentially connected surfaces, the at least two second electroacoustic holes 1132 may be located on different side surfaces of the side portions 113.

When the cross-section of the main body 11 is a triangle or a polygon, that is, when the cross-section of the main body 11 forms three or more sides, the second electroacoustic holes 1132 may be provided on at least two sides of the cross-section of the main body 11. Alternatively, when the side portion 113 has three or more mutually connected side surfaces, the first electroacoustic hole 1131 may be provided on at least two side surfaces of the side portion 113. In some embodiments, the second electroacoustic holes 1132 can be provided on the side surfaces of the side portion 113 one by one. It should be noted that when the side portion 113 has a number of connected side surfaces, the number of the at least two second electroacoustic holes 1132 may be equal to the number of the side surfaces of the side portions 113, and each side surface is provided with one corresponding first electroacoustic hole 1131, that is, the side surfaces of the side portion 113 are corresponding to the second electroacoustic holes 1132 one by one.

In some embodiments, the size of the second electroacoustic holes 1132 is larger than that of the corresponding second electroacoustic channel 1311. For example, the diameter of the second electroacoustic hole 1132 is larger than that of the second electroacoustic channel 1311.

When the second electroacoustic assembly 13 is placed inside the main body 11, the first opening 1111 may be covered by the second outer cover 18. The second outer cover 18 can not only function as a dustproof, but also can protect the second electroacoustic assembly 13. It should be noted that a waterproof ring may be disposed on the periphery of the second outer cover 18 to achieve waterproof.

In some embodiments, after the second electroacoustic assembly 13 is placed inside the main body 11, the second electroacoustic assembly 13 can abut against the inner surface of the main body 11 to achieve a fixed connection between the second electroacoustic assembly 13 and the main body 11. The second electroacoustic assembly 13 can also be secured by a positioning structure disposed in the main body 11. For example, referring to FIG. 7, FIG. 13, FIG. 14 and FIG. 25, the inner surface of the main body 11 may be provided with a second placing plate 1136 for placing the second electroacoustic assembly 13, that is, the second electroacoustic assembly 13 may be placed on the second placing plate 1136, or the second electroacoustic assembly 13 terminates at the second placing plate 1136. So, the second electroacoustic assembly 13 is limited between the second end portion 112 and the second placing plate 1136, in other words, the second electroacoustic assembly 13 is constrained between the second outer cover 18 and the second placing plate 1136, that means the second electroacoustic assembly 13 is constrained at a position adjacent to the second end portion 112. The second electroacoustic assembly 13 can receive sound signals from the external to its position between the second placing plate 1136 and the second outer cover 18, that is, the second electroacoustic assembly 13 is positioned near the second end portion 112 and receive sound signals from the external of the electronic device 10.

The second placing plate 1136 can be disposed around the inner surface of the main body 11, and the second placing plate 1136 can also be formed by one or more protruding structures extending from the inner surface of the main body 11.

When the second electroacoustic assembly 13 is placed in the main body 11, the second electroacoustic circuit board 133 can be adjacent to the second end portion 112. It should be noted that the second electroacoustic circuit board 133 can also be away from the second end portion 112 to facilitate the connection of the second electroacoustic circuit board 133 and the main board 15.

It also should be noted that, the second opening 1121 may not be covered by the second outer cover 18, but is directly covered by the second electroacoustic assembly 13. One end of the second electroacoustic assembly 13 may be flush with the second end portion 112 of the main body 11 to cover the second opening 1121. In another embodiment, a portion of the second electroacoustic assembly 13 may protrude out from the main body 11 and cover the second opening 1121 of the second end portion 112.

In some embodiments, the second electroacoustic assembly 13 can include a second connecting portion and a second enclosing portion that are connected with each other, and the second connecting portion and the second enclosing portion can be formed on the second electroacoustic carrier 131. The second connecting portion may be inserted into the main body 11 through the second opening 1121 and fixedly connected to the main body 11. For example, an outer surface of the second connecting portion is provided with external screw threads, the inner surface of the main body 11 is provided with internal screw threads, and the second connecting portion and the main body 11 are fixedly connected by screwing the external screw threads of the second connecting portion with the internal screw threads of the main body 11. The second enclosing portion is configured to cover the second opening 1121. One end of the second enclosing portion may be flush with the second end portion 112, and the second enclosing portion may also be placed on the second end portion 112.

In some embodiments, the second electroacoustic assembly 13 can include a second sleeving portion and a second covering portion that are connected with each other, and the second sleeving portion and the second covering portion can be formed on the second electroacoustic carrier 131. The second sleeving portion may be sleeved on the outer surface of the main body 11 and fixedly connected to the main body 11. For example, an inner surface of the second sleeving portion is provided with internal screw threads, the outer surface of the main body 11 is provided with external screw threads, and the second sleeving portion and the main body 11 are fixedly connected by screwing the external screw threads of the main body 11 with the internal screw threads of the second sleeving portion. The second covering portion is configured to cover the second opening 1121.

In some embodiments, after the second electroacoustic assembly 13 is placed inside the main body 11, the second electroacoustic assembly 13 can cover the second opening 1121 and be directly connected to the inner surface of the main body 11 by screwing, snapping, plugging or the like.

It should be noted that the second electroacoustic assembly 13 is not limited to be placed between the second placing plate 1136 and the second outer cover 18, and can also be placed at other locations of the main body 11. For example, the second electroacoustic assembly 13 is disposed at a central position of the main body 11 or at a position close to the central position of the main body 11.

Figure 30:
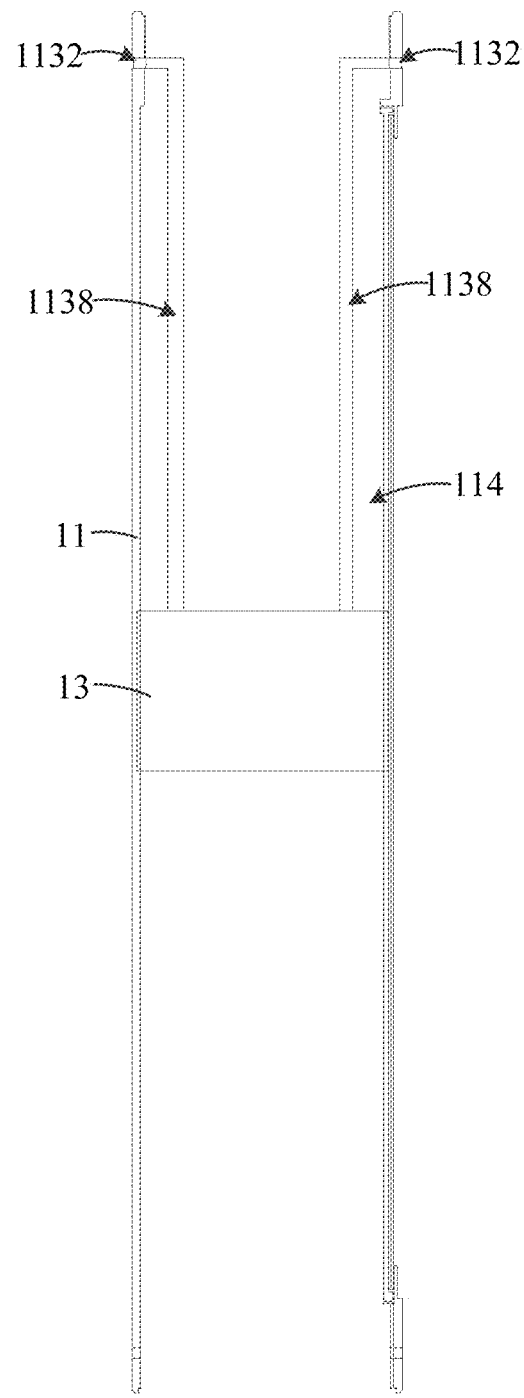
FIG. 30 is a schematic diagram showing the second electroacoustic assembly cooperated with a portion of the main body in an electronic device according to an embodiment of the disclosure.

Referring to FIG. 30, which is a schematic diagram showing the cooperation of the second electroacoustic assembly and the main body in the electronic device according to an embodiment of the disclosure. The second electroacoustic assembly 13 can be disposed at an intermediate position of the main body 11. The main body 11 is provided with at least two second transmission channels 1138, and the at least two second transmission channels 1138 are respectively connected to the at least two second electroacoustic channels 1311 and the at least two second electroacoustic holes 1132. Therefore, the second electroacoustic component 132 can transmit or receive the sound signals through the at least two second electroacoustic channels 1311, the at least two second transmission channels 1138, and the at least two second electroacoustic holes 1132. For example, the second electroacoustic component 132 can receive sound signals from the outside of the main body 11 through the at least two second electroacoustic channels 1311, the at least two second transmission channels 1138, and the at least two second electroacoustic holes 1132.

Figure 31:
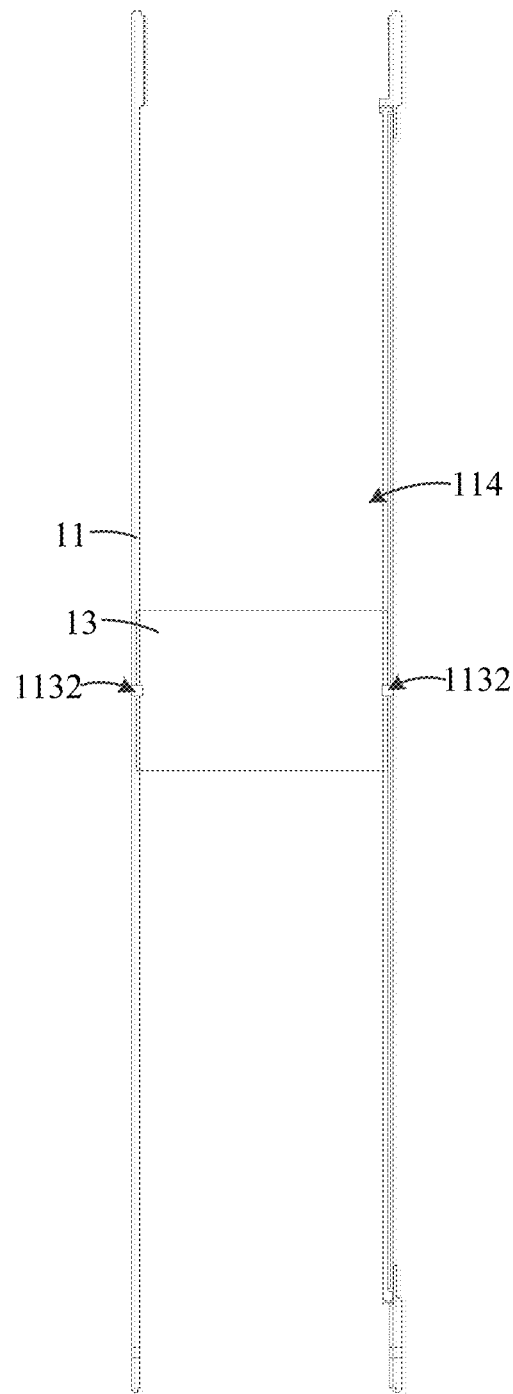
FIG. 31 is another schematic diagram showing the second electroacoustic assembly cooperated with a portion of the main body in the electronic device according to an embodiment of the disclosure.

Referring to FIG. 31, FIG. 31 is another schematic diagram showing the cooperation of the second electroacoustic assembly and a portion of the main body in an electronic device according to an embodiment of the disclosure. The differences between the FIG. 30 and FIG. 31 are as follows: the at least two second electroacoustic holes 1132 can be disposed at an intermediate position of the main body 11, that is, the at least two second electroacoustic holes 1132 are disposed at a connection position of the main body 11 and the second electroacoustic assembly 13. As such, the at least two second electroacoustic channels 1311 on the second electroacoustic assembly 13 can be directly in communication with the at least two second electroacoustic holes 1132. The second electroacoustic component 132 can transmit sound signals through the at least two second electroacoustic channels 1311 and the at least two second electroacoustic holes 1132.

It should be noted that the second electroacoustic assembly 13 can also be disposed at other positions of the main body 11 and will not be exemplified herein.

In some embodiments, the first electroacoustic assembly 12 and the second electroacoustic assembly 13 may be disposed at both end portions of the main body 11, that is, the first electroacoustic assembly 12 is disposed at the first end portion 111, and the second electroacoustic assembly 13 is disposed at the second end portion 112. The first electroacoustic assembly 12 and the second electroacoustic assembly 13 are spaced apart from each other and away from each other, thereby preventing crosstalk between the first electroacoustic assembly 12 and the second electroacoustic assembly 13 and improving the quality of sound transmission. The first electroacoustic component 122 of the first electroacoustic assembly 12 is exemplified by a receiver, and the second electroacoustic component 132 of the second electroacoustic assembly 13 is exemplified by a microphone. So, the receiver disposed at the first end 111 of the main body 11 can transmit the sound signals in multiple directions, and the microphone disposed at the second end 112 of the main body 11 can receive the sound signals in multiple directions.

Figure 32:
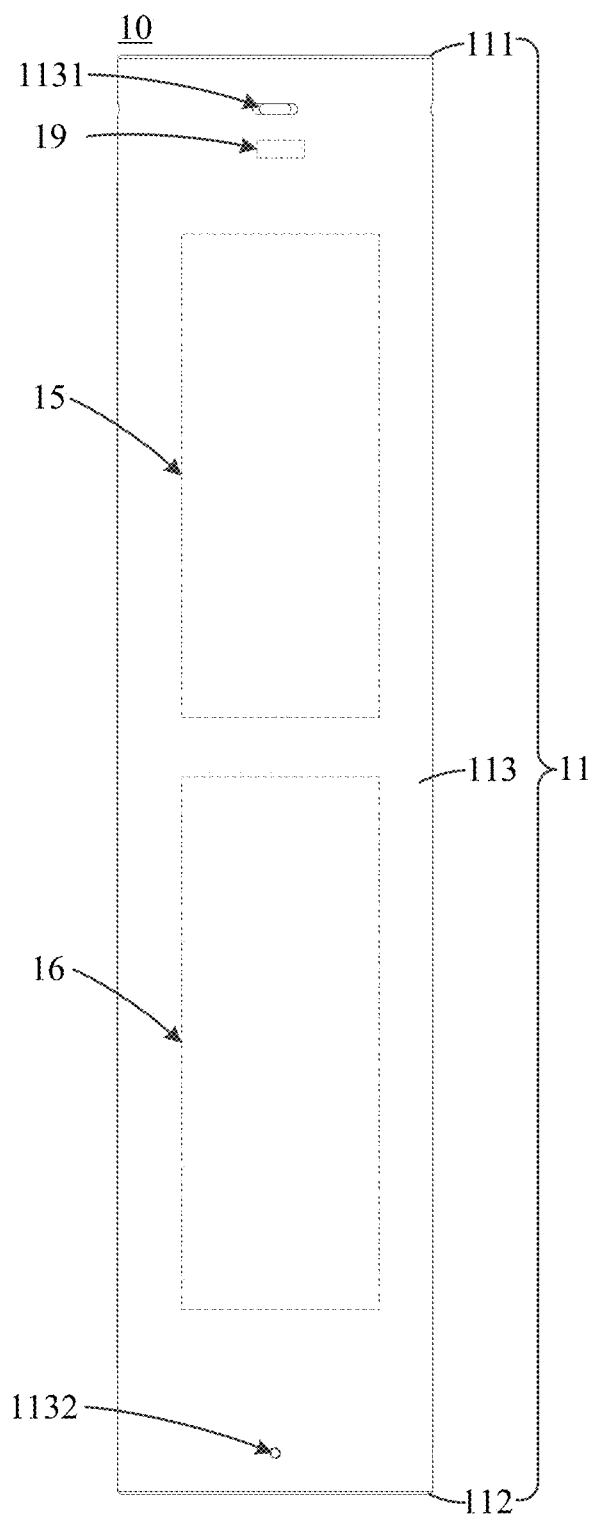
FIG. 32 is another schematic structural diagram of the electronic device according to an embodiment of the disclosure.

In order to further improve the quality of transmitting the sound signals, in some embodiments, please refer to FIG. 32, which is another schematic structural diagram of an electronic device according to an embodiment of the disclosure. The electronic device 10 can provide a sub-microphone 19 at the first electroacoustic assembly 12, and the sub-microphone 19 can reduce noise to improve the quality of transmitting the sound signals.

It should be noted that, the manner of arranging the first electroacoustic assembly 12 and the second electroacoustic assembly 13 in the main body 11 is not limited thereto. For example, the first electroacoustic assembly 12 can be disposed at the first end portion 111. The second electroacoustic assembly 13 may be disposed at a position away from the second end portion 112, such as an intermediate position of the main body 11. For another example, the first electroacoustic assembly 12 may be disposed at a position away from the first end portion 111, such as an intermediate position of the main body 11. The second electroacoustic assembly 13 also can be disposed at the second end portion 112. For another example, the first electroacoustic assembly 12 and the second electroacoustic assembly 13 are both disposed at an intermediate position of the main body 11, and the first electroacoustic assembly 12 and the second electroacoustic assembly 13 may be adjacent to or spaced apart from each other.

Figure 33:
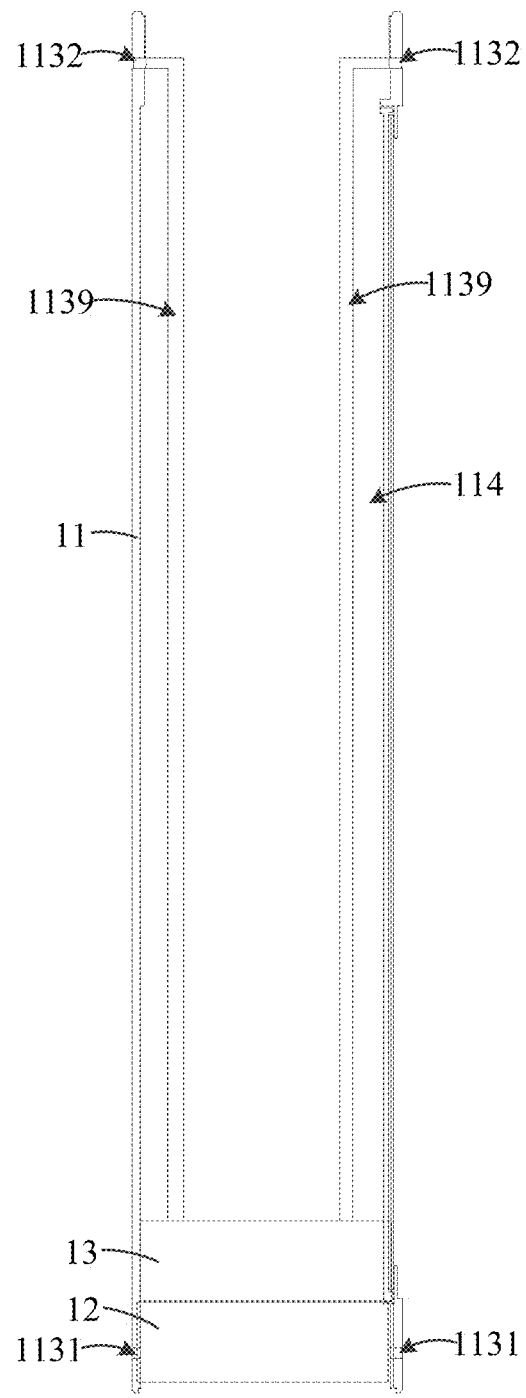
FIG. 33 is a schematic diagram showing the cooperation of the first electroacoustic assembly, the second electroacoustic assembly, and a portion of the main body in the electronic device according to an embodiment of the disclosure.

Referring to FIG. 33, which is a schematic diagram showing the cooperation of a first electroacoustic assembly, a second electroacoustic assembly and a portion of the main body in an electronic device according to an embodiment of the disclosure. The first electroacoustic assembly 12 and the second electroacoustic assembly 13 may be disposed at the same end of the main body 11, and the first electroacoustic component 12 and the second electroacoustic component 13 may be disposed at the first end portion 111 of the main body 11. The main electroacoustic hole 1131 is disposed at a position close to the first end portion 111, details can be referred to the above first electroacoustic hole 1131 and are not described herein again. The second acoustic hole 1132 is disposed in the main body 11 at a position close to the second end portion 112, details can be referred to the above second electroacoustic hole 1132 and are not described herein again. The first electroacoustic channel 1211 of the first electroacoustic component 12 can be in direct communication with the first electroacoustic hole 1131. The second electroacoustic channel 1311 of the second electroacoustic assembly 13 can be communicated with the second electroacoustic hole 1132 through a third transmission channel 1139. Therefore, the first electroacoustic component 122 can transmit the sound signals through the first electroacoustic channel 1211 and the first electroacoustic hole 1131, and the second electroacoustic component 132 can transmit or receive sound signals through the second electroacoustic channel 1311, the third transmission channel 1139, and the second electroacoustic sound hole 1132.

It should be noted that when the first electroacoustic assembly 12 and the second electroacoustic assembly 13 are adjacent, the first electroacoustic carrier 121 and the second electroacoustic carrier 131 may be integrally formed to form an electroacoustic carrier, and the receiver and the microphone are all placed on the same electroacoustic carrier.

In some embodiments, the number of the at least two second electroacoustic holes 1132 and the number of the at least two first electroacoustic holes 1131 may be the same. For example, the number of the at least two second electroacoustic holes 1132 is four, and the number of the at least two first electroacoustic holes 1131 also is four. It should be noted that the number of the at least two second electroacoustic holes 1132 may be not the same as the number of the at least two first electroacoustic holes 1131. For example, the number of the at least two second electroacoustic holes 1132 is four, and the number of the at least two first electroacoustic holes 1131 is six.

In some embodiments, the at least two second electroacoustic holes 1132 correspond to the at least two first electro-acoustic holes 1131 one by one. For example, the projection of the at least two second electroacoustic holes 1132 at the first end portion 111 overlaps with the projection of the at least two first electroacoustic holes 1131 at the first end portion 111, or the projection of the at least two second electroacoustic holes 1132 at the second end portion 112 overlaps with the projection of the at least two first electroacoustic holes 1131 at the second end portion 112. It should be noted that the second electroacoustic holes 1132 and the first electroacoustic holes 1131 may not be correspondingly positioned, and the second electroacoustic holes 1132 and the first electroacoustic holes 1131 may be offset from each other. It can be understood that the at least two first electroacoustic channels 1211 are in communication with the at least two first electroacoustic holes 1131, and the at least two second electroacoustic channels are in communication with the at least two second electroacoustic holes 1132.

It can be seen from the above that the embodiments of the disclosure can realize multi-directional sound input and output. It should be noted that the embodiment of the disclosure is not limited thereto. For example, the embodiment of the disclosure can implement multi-directional sound input, but not multi-directional sound output. Specifically, in the embodiment of the disclosure, the second electroacoustic hole 1132 may be just one, and the first electroacoustic hole 1131 is at least two. For another example, the embodiment of the disclosure can realize multi-directional sound input without realizing multi-directional sound output. Specifically, in the embodiment of the disclosure, the first electroacoustic hole 1131 may be just one, and the second electroacoustic hole 1132 may be at least two.

It should be noted that the electronic device 10 may not be provided with the first electroacoustic carrier 121 and the second electroacoustic carrier 131, and the electronic device 10 may directly set the receiver and the microphone inside the main body 11. The receiver mounted inside the electronic device 10 can be connected to the first electroacoustic circuit board 122, and the microphone mounted inside the electronic device 10 can be connected to the second electroacoustic circuit board 132. It is also possible that the receiver and the microphone are coupled to the main board 15.

The main body 11 can directly define a number of first electroacoustic holes 1131 communicating with the receiver, and the receiver can directly transmit sound signals through the first electroacoustic holes 1131. It should be noted that the first electroacoustic holes 1131 are spaced apart in the direction of surrounding the side portion 113. The arrangement of the first electroacoustic holes 1131 can be referred to the above description, and details are not described herein again.

The main body 11 can directly define a number of second electroacoustic holes 1132 communicating with the microphone, and the microphone can directly receive sound signals through the second electroacoustic holes 1132. It should be noted that the second electroacoustic holes 1132 are spaced apart in the direction of surrounding the side portion 113. The arrangement of the second electroacoustic holes 1132 can be referred to the above description, and details are not described herein again.

The flexible display 14 is used to display images. The flexible display 14 can be made of a flexible material and can be bent.

In some embodiments, one end of the flexible display 14 may be fixed in the main body 11, the other end of the flexible display 14 may be located at the external of the electronic device 10 or located at the main body 11 of the electronic device 10. The flexible display 14 can be retracted within the receiving cavity 114 of the main body 11, as shown in FIGS. 1-5.

In some embodiments, when the flexible display 14 is received within the receiving cavity 114, the flexible display 14 can display through a light transmissive region 115 and a transparent cover plate 141. For example, a portion of the flexible display 14 is located at the position of the light transmitting region 115 and is located below the transparent cover plate 141. For another example, the flexible display 14 can be received in the middle of the main body 11 and away from the transparent cover plate 141. It should be noted that when the flexible display 14 is received in the receiving cavity 114, the flexible display 114 may not display images, and another display screen may be designed at the position of the light transmitting region 115 for display.

Figure 34:
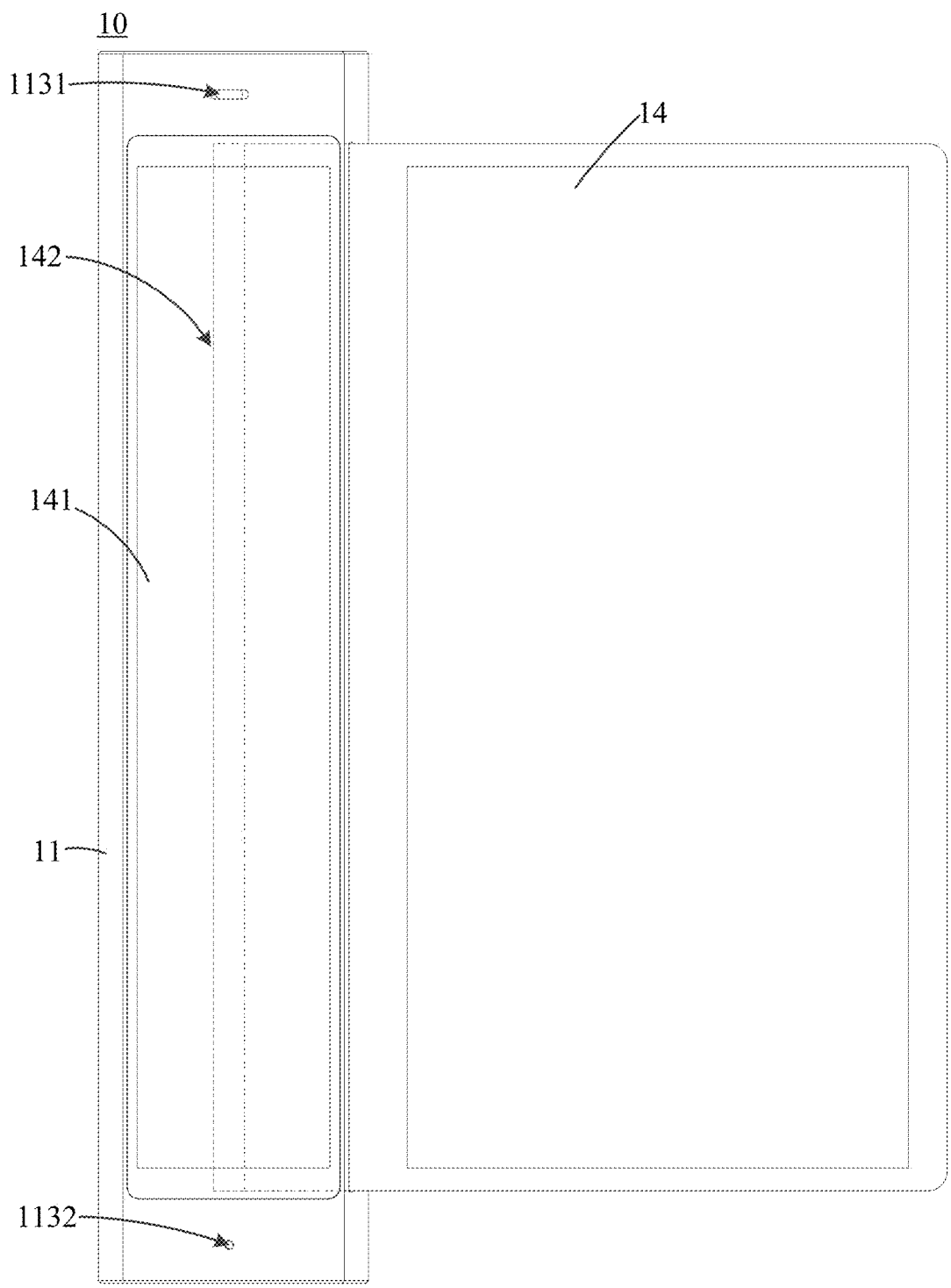
FIG. 34 is a schematic illustration showing a flexible display of the electronic device of FIG. 1 is in an unfolded state.
Figure 35:
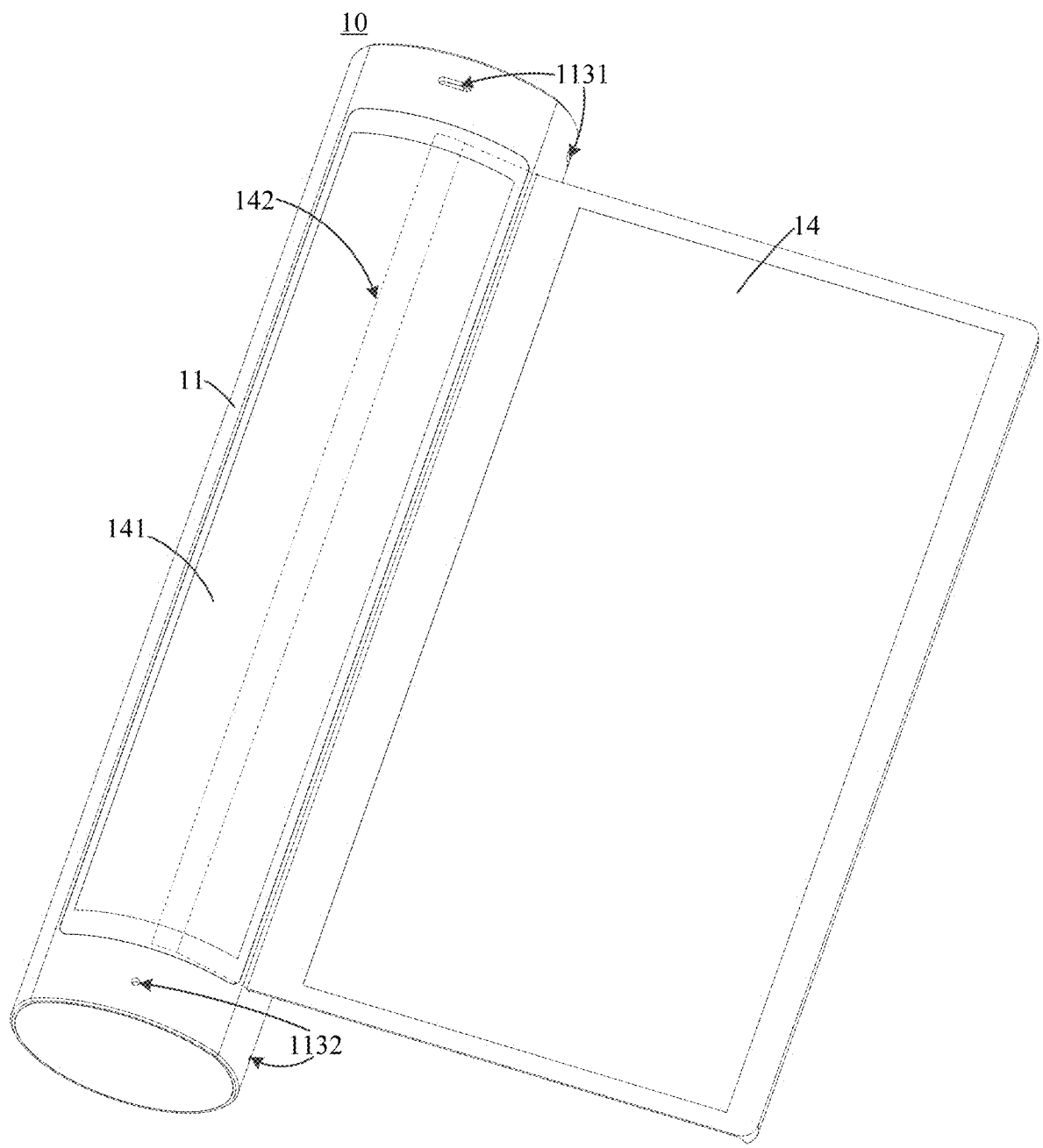
FIG. 35 is a perspective view of the flexible display of the electronic device of FIG. 34 in the unfolded state.

Referring to FIG. 34 and FIG. 35, FIG. 34 is a schematic view showing the flexible display of the electronic device shown in FIG. 1 is in a rolled-out state, and FIG. 35 is a perspective view showing the flexible display of the electronic device shown in FIG. 34 is in the rolled-out state. The flexible display 14 can be pulled out of the electronic device 10 through one end of the flexible display 14. In some embodiments, the electronic device 10 may further include a rotating shaft 142, which may be disposed in the main body 11 or in the receiving cavity 114 of the main body 11. The rotating shaft 142 is rotatable relative to the main body 11.

In some embodiments, referring to FIGS. 6 and 7, the main body 11 may define a third opening 1133 formed therein, the flexible display 14 may pass through the third opening 1133 and set one end of the flexible display 14 outside of the main body 11 or located at the third opening 1133. In order to keep one end of the flexible display 14 located outside of the main body 11 or at the third opening 1133, the main body 11 may be provided with a positioning structure 1134 at the third opening 1133 to position one end of the flexible display 14 outside of the main body 11 or at the third opening 1133 through the positioning structure 1134.

The other end of the flexible display 14 can be fixed to the rotating shaft 142 through the third opening 1133. The flexible display 14 can be wound on the rotating shaft 142. During the winding of the flexible display 14 on the rotating shaft 142, the flexible display 14 is gradually accommodated in the receiving cavity 114 of the main body 11 is as shown in FIGS. 1-5. For example, the rotating shaft 142 is rotated clockwise, and the flexible display 14 can be wound on the rotating shaft 142 to receive the flexible display 14 in the receiving cavity 114.

After positioning one end of the flexible display 14 outside of the main body 10 or at the third opening 1133, the rotating shaft 142 can be rotated through the one end of the flexible display 14, thereby the flexible display 14 received in the receiving cavity 114 can be pulled out of the main body 10 and can display images as shown in FIGS. 34 and 35. For example, the rotating shaft 142 is rotated counter-clockwise, and the flexible display 14 can be driven to the outside of the main body 11 for display.

In other words, the electronic device 10 has a first state and a second state. In the first state, the flexible display 14 is wounded on the rotating shaft 142 and is received in the receiving cavity 114 of the main body 11. In the second state, at least portion of the flexible display 14 is released from the rotating shaft 142 and is pulled to be extended out of the main body 11 through the third opening 1133 of the side portion 113.

In some embodiments, the flexible display 14 can display images on the side portion 113. When the side portion 113 is a cylindrical structure, the flexible display 14 can be laid on a portion of an outer surface of the side portion 113 for display. When the side portion 113 has at least two side surfaces, the flexible display 14 can be laid on one or more side surfaces of the side portion 113 for display.

The main board 15 can be arranged in a plate shape or in an arc shape. The main body 15 can be connected with the electroacoustic component such as receiver, microphone, and the like. The main board 15 also can be connected with optical components such as projection optical modules, ambient light sensors, camera modules, indicator lights, and the like. The main board 15 is capable of controlling components in the electronic device 10. The main board 15 also can be connected to the flexible display 14, and can control the display of the flexible display 14.

Figure 36:
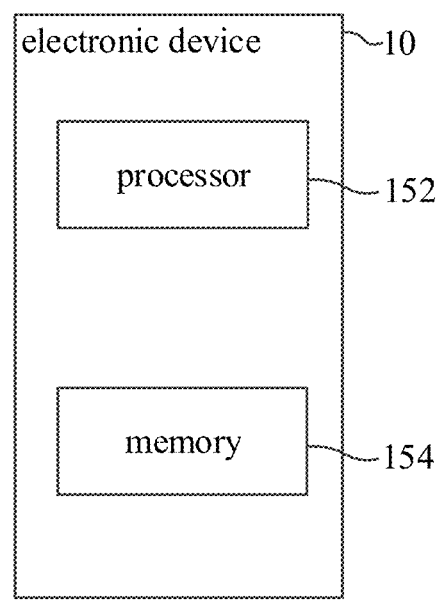
FIG. 36 is a block diagram of the electronic device according to an embodiment of the disclosure.

Referring to FIG. 36, FIG. 36 is a block diagram of the electronic device provided by an embodiment of the disclosure. The electronic device 10 can include a processor such as the processor 152, which is integrated on the main board 15. The processor 152 can control the images displayed by the flexible display 14. The processor 152 also can control a driving mechanism to drive the rotating shaft 142 to rotate, such that the flexible display 14 is driven to be received in the main body 11 or extended out of the main body 11. The processor 152 also can be used to control the transmission of the sound signals by the electroacoustic component.

In some embodiments, the processor 152 can control, according to a first control instruction, the electroacoustic component to transmit sound signals from the inside of the main body 11 toward the outside or to receive sound signals from the outside, through one of the at least two electroacoustic holes. The processor 152 can control, according to a second control instruction, the electroacoustic component to transmit sound signals from the inside of the main body 11 toward the outside or to receive sound signals from the outside, through the at least two electroacoustic holes.

It can be understood that the electronic device 10 of the embodiment of the disclosure can stand by the supporting of one end thereof, and a first electroacoustic hole such as the first electroacoustic hole 1131 and a second electroacoustic hole such as the second electroacoustic hole 1132 can transmit sound signals in one direction. It applies to situations where one or several people are in the same location or scenarios. In practical applications, when the sound signals acquired by the processor 152 just form one person, the transmission of the sound signals can be in the direction toward the person. That is, the first control instruction includes the instruction formed by the processor 152 in response to acquiring one kind of sound signals.

It can also be understood that the electronic device 10 of the embodiment of the disclosure can stand by the supporting of one end thereof, and a number of first electroacoustic holes such as the first electroacoustic holes 1131 and a number of second electroacoustic holes such as the second electroacoustic holes 1132 can transmit sound signals in multiple directions. In practical applications, when the sound signals acquired by the processor 152 are different, the processor 152 determines that there are multiple people sharing the electronic device at this time, and the processor 152 may control the electroacoustic component to transmit the sound signals in multiple directions, such as in a multi-person meeting scene. That is, the second control instruction includes the instruction formed by the processor 152 in response to acquiring sound signals from an instruction formed by at least two kinds of sound signals.

It should be noted that the first control instruction and the second control instruction are not limited thereto.

In some embodiments, the first control instruction includes a first touch operation, the second control instruction includes a second touch operation, and the first touch operation is different from the second touch operation. The first touch operation may be a click operation, and the second touch operation may be a long press operation. It should be noted that the first touch operation may also be a long press operation, and the second touch operation may also be a click operation. It should be noted that a physical button or a virtual button may be disposed on the electronic device 10 to facilitate a click operation or a long press operation. The first touch operation and the second touch operation may be performed at the same position, or may be performed at different positions. It should be noted that when the first touch operation and the second touch operation are performed at different positions, the touch manners of the first touch operation and the second touch operation may be the same.

As shown in FIG. 36, the electronic device 10 can include a memory 154 that may be integrated on the main board 15. The memory 154 can store data, such as the data waited to be processed by the processor 152, or the data that the processor 152 has processed yet.

The battery 16 may be a rectangular structure or a cylindrical structure. The battery 16 can be electrically connected to the main board 15, and the battery 16 can supply power to the electronic device 10. In some embodiments, the main board 15 and the battery 16 may be disposed between the first electroacoustic assembly 12 and the second electroacoustic assembly 13. The first electroacoustic assembly 12, the main board 15, the battery 16, and the second electroacoustic assembly 13 may be arranged side by side.

The electroacoustic carrier, the electroacoustic assembly and the electronic device provided by the embodiments of the disclosure are described in detail above. The principles and embodiments of the disclosure are set forth in the specific examples, and the description of the above embodiments is only for the purpose of understanding the disclosure. Those skilled in the art will have various changes in the specific embodiments and application scopes according to the idea of the disclosure. In summary, the content of the present specification should not be construed as limiting the disclosure.

What is claimed is:

1. An electronic device, comprising:
a main body, comprising a first end portion and a side portion coupled to the first end portion, the main body being enabled in a standing state by the supporting of the first end portion, the side portion defining a receiving cavity, a third opening, and at least two first electroacoustic holes, the third opening being in communication with the receiving cavity, a longitudinal direction of the third opening being parallel to a central axis of the main body, the at least two first electroacoustic holes being spaced apart in a direction surrounding the side portion;
at least one electroacoustic component, disposed in the main body and configured to transmit sound signals through the at least two first electroacoustic holes;
a flexible display, having a first state received in the receiving cavity of the main body and a second state extended from the main body through the third opening of the side portion; and
a rotating shaft, disposed in the receiving cavity, the flexible display being wound on the rotating shaft in the first state.

2. The electronic device according to claim 1, wherein the main body is cylindrical in structure, and the at least two first electroacoustic holes are disposed along a radial direction of the main body.

3. The electronic device according to claim 1, wherein a cross-section of the main body, perpendicular to a central axis of the main body, is a polygon, an outer face of the side portion comprises at least three side faces connected in sequence, and the at least two electroacoustic holes are located at different side faces of the side portion.

4. The electronic device according to claim 1, wherein the at least two electroacoustic holes have same depth and are equally spaced at an outer face of the side portion.

5. The electronic device according to claim 4, wherein the main body further comprises a first electroacoustic carrier received in the first end portion and a second electroacoustic carrier received in the second end portion, the at least one electroacoustic component comprises a first electroacoustic component and a second electroacoustic component, the first electroacoustic component being disposed on the first electroacoustic carrier and far away from the second electroacoustic carrier, and the second electroacoustic component being disposed on the second electroacoustic carrier and far away from the first electroacoustic carrier.

6. The electronic device according to claim 5, wherein the first electroacoustic carrier defines at least two first electroacoustic channels communicated with the at least two first electroacoustic holes, the second electroacoustic carrier defines at least two second electroacoustic channels communicated with the at least two second electroacoustic holes.

7. The electronic device according to claim 6, wherein the at least two first electroacoustic channels define a first junction, the first electroacoustic component being positioned in the first junction, the at least two second electroacoustic channels define a second junction, and the second electroacoustic component being positioned in the second junction.

8. The electronic device according to claim 1, wherein the main body further comprises a second end portion, the side portion connects the first end portion and the second end portion, the at least two first electroacoustic holes are adjacent to the first end portion, the side portion further defines at least two second electroacoustic holes adjacent to the second end portion.

9. The electronic device according to claim 8, wherein the at least one electroacoustic component comprises a receiver and a microphone disposed in a middle portion of the main body, the main body defines a first transmission channel communicated with the at least two first electroacoustic holes and a second transmission channel communicated with the at least two second electroacoustic holes, the receiver transmits sound signals from the internal of the main body to the external through the first transmission channel and the at least two first electroacoustic holes, and the microphone receives sound signals from the external through the second transmission channel and the at least two second electroacoustic holes.

10. The electronic device according to claim 1, wherein the first end portion defines a first opening, the electronic device further comprises a first electroacoustic carrier positioned in the first opening, the electroacoustic carrier defines at least two electroacoustic channels communicated with the at least two electroacoustic holes respectively, and the electroacoustic component is disposed on the electroacoustic carrier and coupled to the at least two electroacoustic channels, and the electroacoustic component transmit sound signals through the at least two electroacoustic channels and the at least two electroacoustic holes.

11. The electronic device according to claim 10, wherein the electronic device further comprises a main board received in the main body and an electroacoustic circuit board electrically connected to the main board, the electroacoustic carrier defines a receiving recess and a placing recess communicated with the receiving recess, the placing recess being configured for placing the electroacoustic circuit board, the receiving recess being configured for receiving the electroacoustic component and being located between the at least two electroacoustic channels and the placing recess.

12. The electronic device according to claim 11, wherein a first placing plate is provided in the main body, the electroacoustic carrier being placed on the first placing plate, the first placing plate being sandwiched between the main board and the electroacoustic carrier.

13. The electronic device according to claim 12, wherein the main body further comprises a first outer cover covering the first opening, the first outer cover comprising a first supporting surface, the first end portion comprising a second supporting surface, the first supporting surface and the second supporting surface are coplanar.

14. An electronic device, comprising:
a main body, comprising a first end portion, a second end portion and a side portion, the side portion connecting the first end portion and the second end portion, the main body being enabled in a standing state by the supporting of the first end portion, the side portion defining at least two first electroacoustic holes adjacent to the first end portion and at least two second electroacoustic holes adjacent to the second end portion, the at least two first electroacoustic holes being spaced apart in a direction surrounding the side portion, the at least two second electroacoustic holes being spaced apart in a direction surrounding the side portion, the main body having a first opening at the first end portion and a second opening at the second end portion;
a first placing plate, disposed in the main body and adjacent to the first end portion;
a first outer cover, covering the first opening;
a second placing plate, disposed in the main body and adjacent to the second end portion;
a second outer cover, covering the second opening; and
at least one electroacoustic component, comprising a receiver and a microphone, wherein the receiver is placed between the first placing plate and the first outer cover, the microphone is placed between the second placing plate and the second outer cover, the receiver transmits sound signals from the internal of the main body toward the external through the at least two first electroacoustic holes, and the microphone receives sound signals from the external through the at least two second electroacoustic holes.

15. The electronic device according to claim 14, wherein the number of the at least two first electroacoustic holes is equal to the number of the at least two second electroacoustic holes, the projections of the at least two first electroacoustic holes at the first end portion overlap with the projections of the at least two second electroacoustic holes at the first end portion.

16. An electronic device, comprising:
a main body, comprising a first end portion and a side portion coupled to the first end portion, the main body being enabled in a standing state by the supporting of the first end portion, the first end portion defining a first opening, the side portion defining at least two first electroacoustic holes, the at least two first electroacoustic holes being spaced apart in a direction surrounding the side portion;
at least one electroacoustic component, disposed in the main body and configured to transmit sound signals through the at least two first electroacoustic holes; and
a first electroacoustic carrier, positioned in the first opening, wherein the electroacoustic carrier defines at least two electroacoustic channels communicated with the at least two electroacoustic holes respectively, and the electroacoustic component is disposed on the electroacoustic carrier and coupled to the at least two electroacoustic channels, and the electroacoustic component transmit sound signals through the at least two electroacoustic channels and the at least two electroacoustic holes;
wherein the electronic device further comprises a main board received in the main body and an electroacoustic circuit board electrically connected to the main board, the electroacoustic carrier defines a receiving recess and a placing recess communicated with the receiving recess, the placing recess being configured for placing the electroacoustic circuit board, the receiving recess being configured for receiving the electroacoustic component and being located between the at least two electroacoustic channels and the placing recess.

17. The electronic device according to claim 16, wherein a first placing plate is provided in the main body, the electroacoustic carrier being placed on the first placing plate, and the first placing plate being sandwiched between the main board and the electroacoustic carrier.

18. The electronic device according to claim 17, wherein the main body further comprises a first outer cover covering the first opening, the first outer cover comprising a first supporting surface, the first end portion comprising a second supporting surface, the first supporting surface and the second supporting surface are coplanar.

19. The electronic device according to claim 16, wherein the side portion further defines a receiving cavity and a third opening communicated with the receiving cavity, a longitudinal direction of the third opening being parallel to a central axis of the main body;
wherein the electronic device further comprises a flexible display and a rotating shaft disposed in the receiving cavity, the flexible display having a first state received in the receiving cavity of the main body and a second state extended from the main body through the third opening of the side portion, the flexible display being wound on the rotating shaft in the first state.

20. The electronic device according to claim 16, wherein the main body is cylindrical, the main body further comprises a second end portion, the side portion connects the first end portion and the second end portion, the at least two first electroacoustic holes are adjacent to the first end portion, the at least two electroacoustic holes have same depth and are equally spaced at an outer face of the side portion, the side portion further defines at least two second electroacoustic holes adjacent to the second end portion, the at least two second electroacoustic holes being equally spaced apart in a direction surrounding the side portion.

* * * * *